(12) United States Patent
Tokumitsu et al.

(10) Patent No.: US 10,229,909 B2
(45) Date of Patent: Mar. 12, 2019

(54) SEMICONDUCTOR DEVICE AND METHOD OF MANUFACTURING THE SAME

(71) Applicant: Renesas Electronics Corporation, Koutou-ku, Tokyo (JP)

(72) Inventors: Shigeo Tokumitsu, Hitachinaka (JP); Hiroki Fujii, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 8 days.

(21) Appl. No.: 15/463,681

(22) Filed: Mar. 20, 2017

(65) Prior Publication Data

US 2017/0287912 A1    Oct. 5, 2017

(30) Foreign Application Priority Data

Mar. 29, 2016  (JP) .................. 2016-065869

(51) Int. Cl.

| | |
|---|---|
| *H01L 27/092* | (2006.01) |
| *H01L 21/8249* | (2006.01) |
| *H01L 27/06* | (2006.01) |
| *H01L 21/762* | (2006.01) |
| *H01L 21/8238* | (2006.01) |
| *H01L 23/528* | (2006.01) |
| *H01L 29/06* | (2006.01) |
| *H01L 29/10* | (2006.01) |

(52) U.S. Cl.
CPC ...... *H01L 27/092* (2013.01); *H01L 21/76224* (2013.01); *H01L 21/8249* (2013.01); *H01L 21/823871* (2013.01); *H01L 21/823878* (2013.01); *H01L 23/528* (2013.01); *H01L 27/0623* (2013.01); *H01L 27/0922* (2013.01); *H01L 29/0649* (2013.01); *H01L 29/1087* (2013.01); *H01L 29/1095* (2013.01); *H01L 21/823892* (2013.01)

(58) Field of Classification Search
CPC ................................... H01L 21/76224
USPC .................................. 257/506, 510
See application file for complete search history.

(56) References Cited

U.S. PATENT DOCUMENTS

| | | | |
|---|---|---|---|
| 9,190,408 B2 * | 11/2015 | Mallikarjunaswamy | ................... H01L 21/82380 |
| 2008/0023787 A1 * | 1/2008 | Shimada | ............... H01L 21/761 257/506 |
| 2015/0041960 A1 | 2/2015 | Morii et al. | |
| 2017/0018502 A1 * | 1/2017 | Ichinose | ............. H01L 23/5283 |

(Continued)

FOREIGN PATENT DOCUMENTS

JP    2015-037099 A    2/2015

*Primary Examiner* — David Vu
*Assistant Examiner* — Brandon Fox
(74) *Attorney, Agent, or Firm* — Sughrue Mion, PLLC

(57) ABSTRACT

A semiconductor device includes a high voltage NMOS transistor formation region defined by an element isolation insulating film, a CMOS transistor formation region defined by an element isolation insulating film, and a substrate contact portion. The substrate contact portion is formed in a region of a semiconductor substrate that is positioned between the high voltage NMOS transistor formation region and the element isolation insulating film so as to reach from the main surface side to a position deeper than the bottom of the element isolation insulating film. The substrate contact portion is in contact with the semiconductor substrate from a depth over a depth.

14 Claims, 26 Drawing Sheets

(56) References Cited

U.S. PATENT DOCUMENTS

2017/0018503 A1\* 1/2017 Levin .................... H01L 27/092

\* cited by examiner

SEMICONDUCTOR DEVICE AND METHOD OF MANUFACTURING THE SAME

This nonprovisional application is based on Japanese Patent Application No. 2016-065869 filed on Mar. 29, 2016 with the Japan Patent Office, the entire contents of which are hereby incorporated by reference.

BACKGROUND OF THE INVENTION

Field of the Invention

The present invention relates to a semiconductor device and a method of manufacturing the same and, for example, is suitably used for a semiconductor device including a substrate contact portion to a semiconductor substrate.

Description of the Background Art

In semiconductor devices mounted on automobiles, a variety of semiconductor elements, for example, such as CMOS (Complementary Metal Oxide Semiconductor) transistors, high voltage NMOS transistors, high voltage PMOS transistors, and bipolar transistors are formed. These semiconductor elements are formed in an element formation region in a semiconductor substrate. The element formation region is defined by an element isolation insulating film formed in the semiconductor substrate.

Furthermore, in such a semiconductor device, a substrate contact portion is formed for fixing the semiconductor substrate to a predetermined potential. The substrate contact portion is disposed in a region outside the element formation region. An example of patent documents disclosing such a substrate contact portion is Patent Document 1 (Japanese Patent Laying-Open No. 2015-37099).

SUMMARY OF THE INVENTION

In a process of manufacturing a semiconductor device, micro-defects (BMD: Bulk Micro Defect) are generated in the semiconductor substrate for gettering of metal contamination. In order to generate micro-defects, oxygen is introduced in advance in the semiconductor substrate. The introduced oxygen is precipitated as $SiO_2$ between lattices by thermal treatment.

As the oxygen concentration in the semiconductor substrate decreases, the lifetime of carriers (electrons or holes) produced in one semiconductor element becomes longer. The inventors of the present invention have found that the distance of diffusion in the semiconductor substrate thus increases, and the diffusing carriers affect the operation of another semiconductor element as leak current.

A semiconductor device according to an embodiment includes a semiconductor substrate, a first element formation region having a first semiconductor element formed therein, a second element formation region having a second semiconductor element formed therein, and a substrate contact portion. The first element formation region is defined by a first insulating isolation portion reaching from the main surface to a first depth. The second element formation region is disposed at a distance from the first element formation region and defined by a second insulating isolation portion reaching from the main surface to the first depth. The substrate contact portion is formed in a region of the semiconductor substrate positioned between the first element formation region and the second element formation region so as to reach from the main surface side to a second depth deeper than the first depth and is in contact with the semiconductor substrate from the first depth over the second depth.

A method of manufacturing a semiconductor device according to another embodiment includes the following steps. A first isolation groove defining a first element formation region and a second isolation groove defining a second element formation region are formed to reach from a main surface of a semiconductor substrate to a first depth, and an opening is formed to reach from the main surface of the semiconductor substrate positioned between the first isolation groove and the second isolation groove to the first depth. An insulating film is formed so as to fill the first isolation groove, the second isolation groove, and the opening, thereby to form a first insulating isolation portion in the first isolation groove and form a second insulating isolation portion in the second isolation groove. Processing is successively performed on a portion of the insulating film buried in the opening and on the semiconductor substrate to form a contact opening passing through the insulating film to reach a second depth deeper than the first depth. A conductor is formed in the contact opening to form a substrate contact portion in which the conductor is in contact with the semiconductor substrate at a portion from the first depth to the second depth.

In the semiconductor device according to an embodiment, malfunction of semiconductor elements due to leak current can be suppressed.

The method of manufacturing a semiconductor device according to another embodiment can produce a semiconductor device in which malfunction of semiconductor elements due to leak current is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor device including a substrate contact portion according to a first embodiment will be described.

As previously described, a variety of semiconductor elements, for example, such as CMOS transistors, high voltage NMOS transistors, high voltage PMS transistors, and bipolar transistors are formed in a semiconductor device. Here, for convenience of explanation, a high voltage NMOS transistor and a CMOS transistor are described as semiconductor elements, by way of example.

Figure 1:
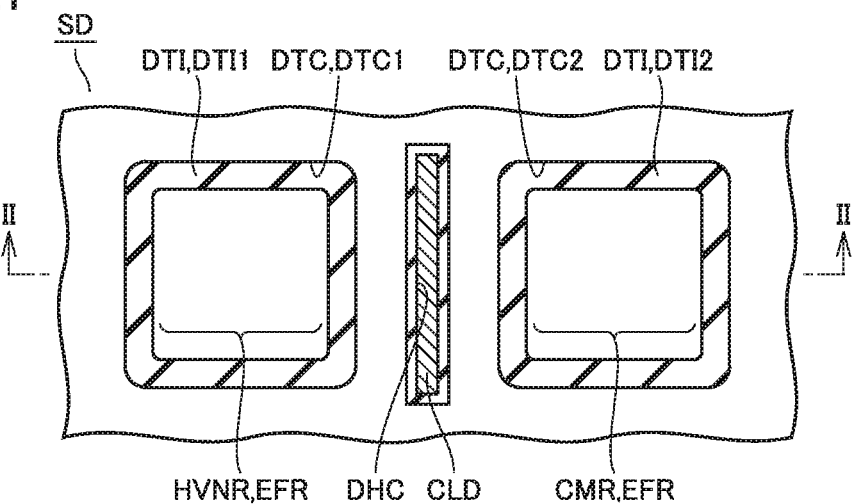
FIG. 1 is a partial plan view of a semiconductor device according to a first embodiment.

As shown in FIG. 1, in a semiconductor device SD, for example, a high voltage NMOS transistor formation region HVNR is defined as one of element formation regions EFR by an element isolation insulating film DTI1 (DTI). In addition, for example, a CMOS transistor formation region CMR is defined as another element formation region EFR by an element isolation insulating film DTI2 (DTI).

High voltage NMOS transistor formation region HVNR and CMOS transistor formation region CMR are disposed at a distance from each other. A substrate contact portion CLD is formed at a region (substrate electrode region SER) of semiconductor substrate SUB that is positioned between high voltage NMOS transistor formation region HVNR and CMOS transistor formation region CMR. Substrate contact portion CLD fixes semiconductor substrate SUB (p-type substrate PSB) to a predetermined potential (see FIG. 3).

Figure 2:
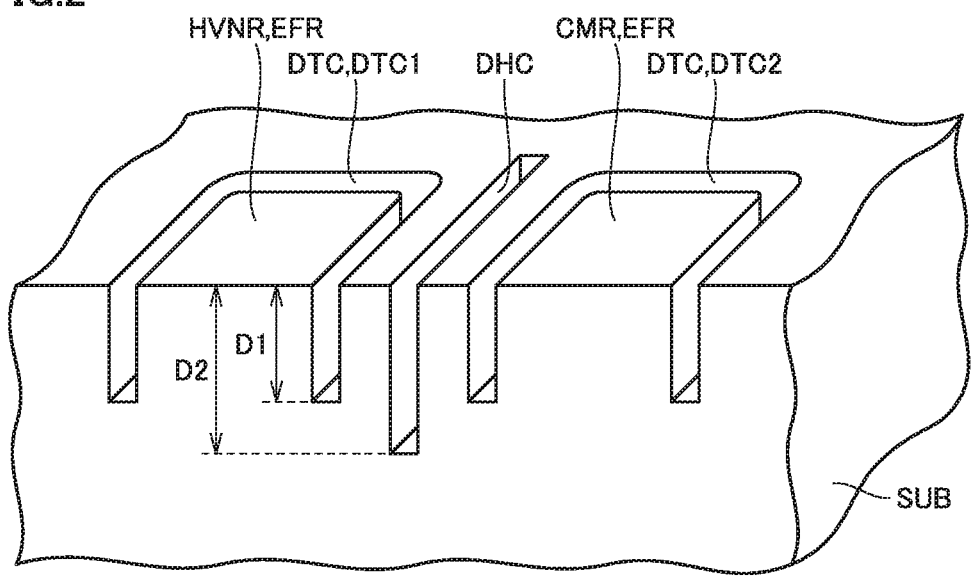
FIG. 2 is a cross-sectional perspective view showing a structure of the semiconductor substrate taken along line II-II shown in FIG. 1 in the first embodiment.

Element isolation insulating film DTI1 (DTI) is formed in a trench DTC1 (DTC). Element isolation insulating film DTI2 (DTI) is formed in a trench DTC2 (DTC). Substrate contact portion CLD is formed in a contact groove DHC. As shown in FIG. 2, contact groove DHC (depth D2) is formed deeper than trenches DTC1, DTC2 (depth D1).

Figure 3:
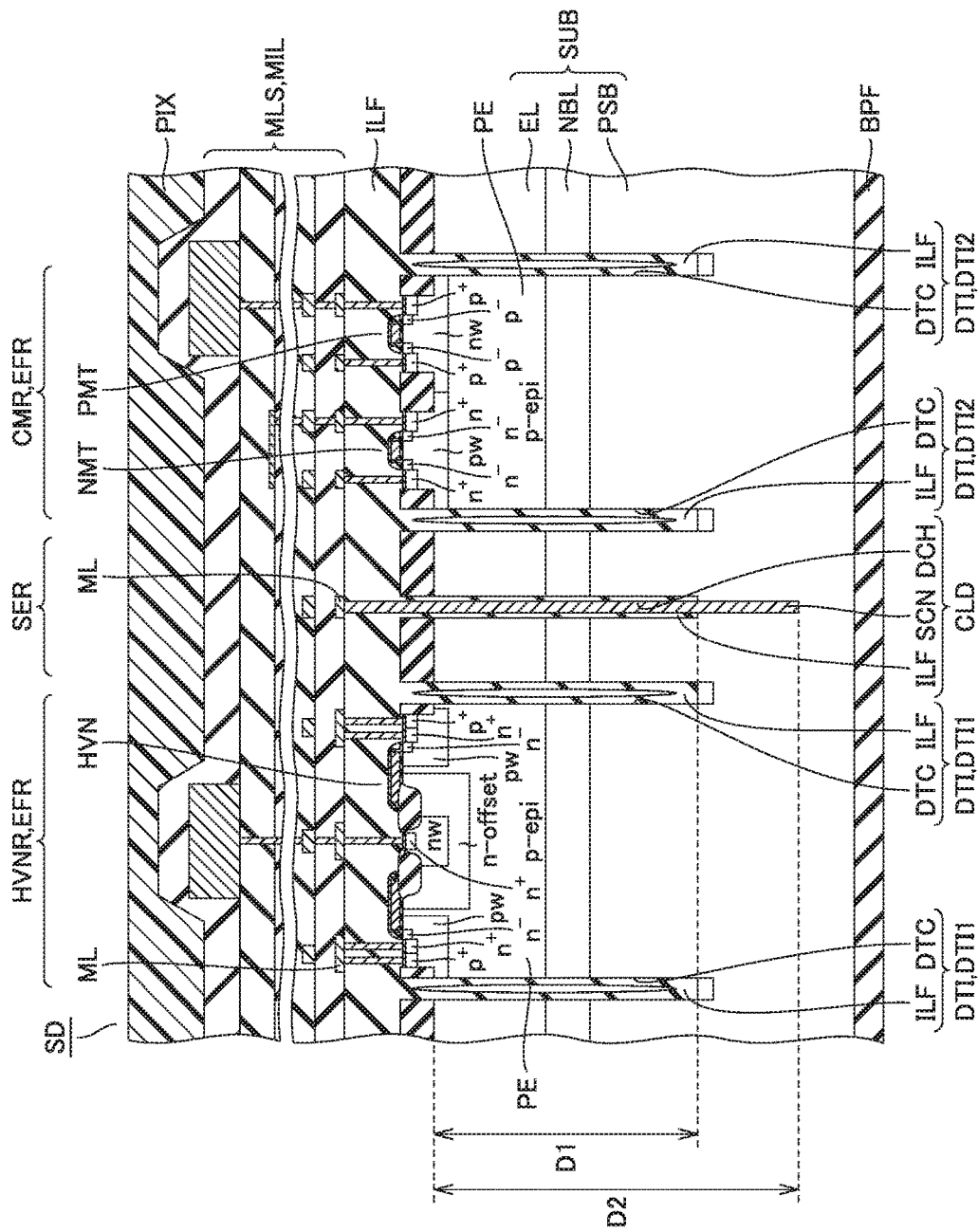
FIG. 3 is a cross-sectional view of the semiconductor device taken along line II-II shown in FIG. 1 in the first embodiment.

The structure of semiconductor device SD will be described in more details. As shown in FIG. 3, semiconductor substrate SUB is formed with a p-type substrate PSB, an n-type buried region NBL, and an epitaxial layer EL. Element isolation insulating films DTI1, DTI2 are formed from the surface of semiconductor substrate SUB over depth D1. Element isolation insulating films DTI1, DTI2 pass through epitaxial layer EL and n-type buried region NBL to reach p-type substrate PSB.

Substrate contact portion CLD is formed from the surface of semiconductor substrate SUB over depth D2. Substrate contact portion CLD passes through epitaxial layer EL and n-type buried region NBL to reach p-type substrate PSB. Of a conductor portion SCN of substrate contact portion CLD, in a portion extending from the surface of semiconductor substrate SUB to depth D1, an insulating film ILF is interposed between conductor portion SCN and semiconductor substrate SUB. In a portion extending from depth D1 to depth D2, conductor portion SCN is in contact with semiconductor substrate SUB (p-type substrate PSB).

In high voltage NMOS transistor formation region HVNR, p-type epitaxial layer PE is formed in epitaxial layer EL. A high voltage MOS transistor HVN is formed in p-type epitaxial layer PE. In CMOS transistor formation region CMR, p-type epitaxial layer PE is formed. An NMOS transistor NMT and a PMOS transistor PMT are formed in p-type epitaxial layer PE.

Insulating film ILF is formed so as to cover high voltage MOS transistor HVN, NMOS transistor NMT, PMOS transistor PMT, and the like. A plurality of first interconnection layers ML are formed on the surface of insulating film ILF. Of a plurality of first interconnection layers ML, a predetermined first interconnection layer ML is electrically connected to conductor portion SCN of substrate contact portion CLD.

On a plurality of first interconnection layers ML, multi-level interconnection layers MLS and multi-level interlayer insulating films MIL for insulating multi-level interconnection layers MLS from each other are formed. A polyimide film PIX is formed so as to cover multilayer interlayer insulating film MIL. Semiconductor device SD according to the first embodiment is configured as described above.

Figure 4:
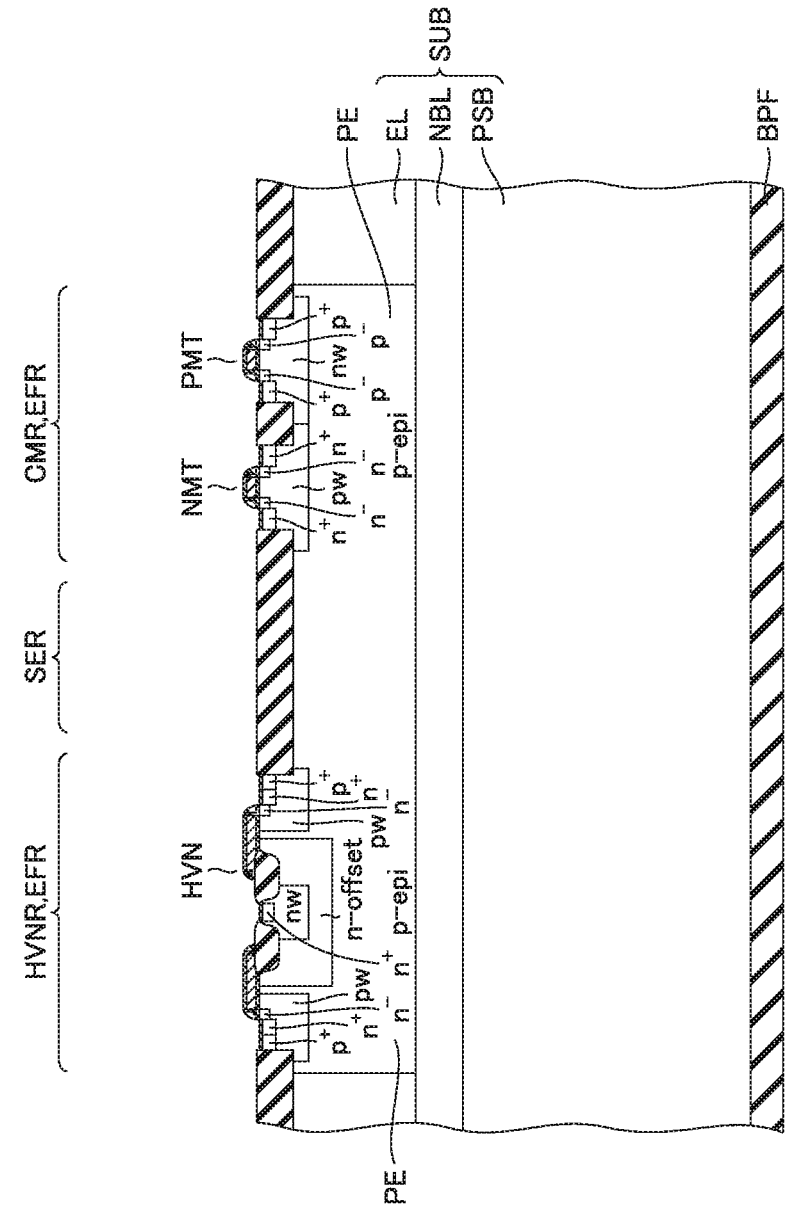
FIG. 4 is a cross-sectional view showing a step in a method of manufacturing a semiconductor device in the first embodiment.

An example of a method of manufacturing the semiconductor device described above will now be described. First, as shown in FIG. 4, high voltage NMOS transistor HVN is formed in high voltage NMOS transistor formation region HVNR in semiconductor substrate SUB, and NMOS transistor NMT and PMOS transistor PMT are formed in CMOS transistor formation region CMR.

Next, for example, a silicon oxide film (not shown) serving as an etching mask is formed so as to cover high voltage NMOS transistor HVN, NMOS transistor NMT, PMOS transistor PMT, and the like. Next, a resist pattern. PR1 (see FIG. 5) for forming a trench is formed by performing a predetermined photolithography process.

Figure 5:
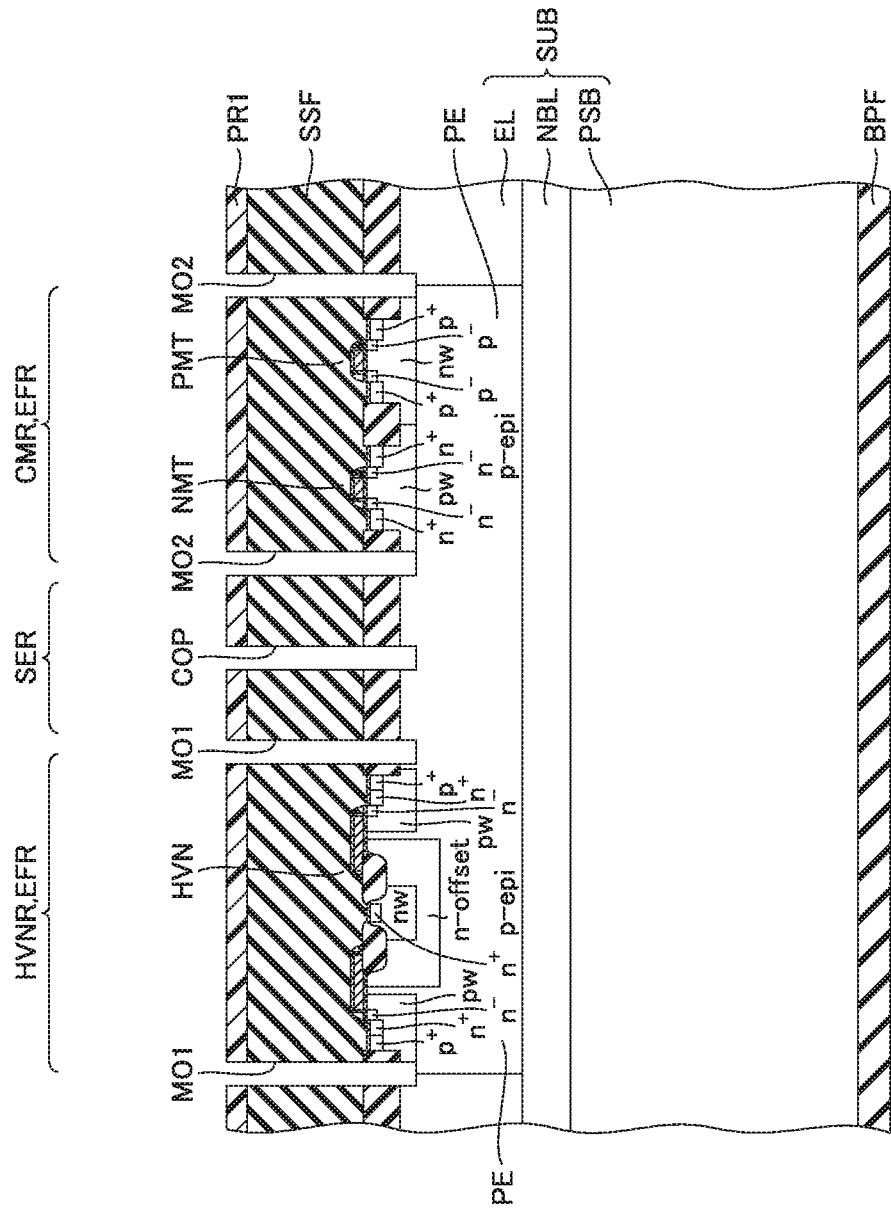
FIG. 5 is a cross-sectional view showing a step performed after the step shown in FIG. 4 in the first embodiment.

Next, as shown in FIG. 5, using resist pattern PR1 as an etching mask, a silicon oxide film SSF is etched to form an opening MO1 reaching p-type epitaxial layer PE in high voltage NMOS transistor formation region HVNR. An opening MO2 reaching p-type epitaxial layer PE is formed in CMOS transistor formation region CMR. In substrate electrode region SER positioned between high voltage NMOS transistor formation region HVNR and CMOS transistor formation region CMR, an opening COP reaching p-type epitaxial layer PE is formed.

Figure 6:
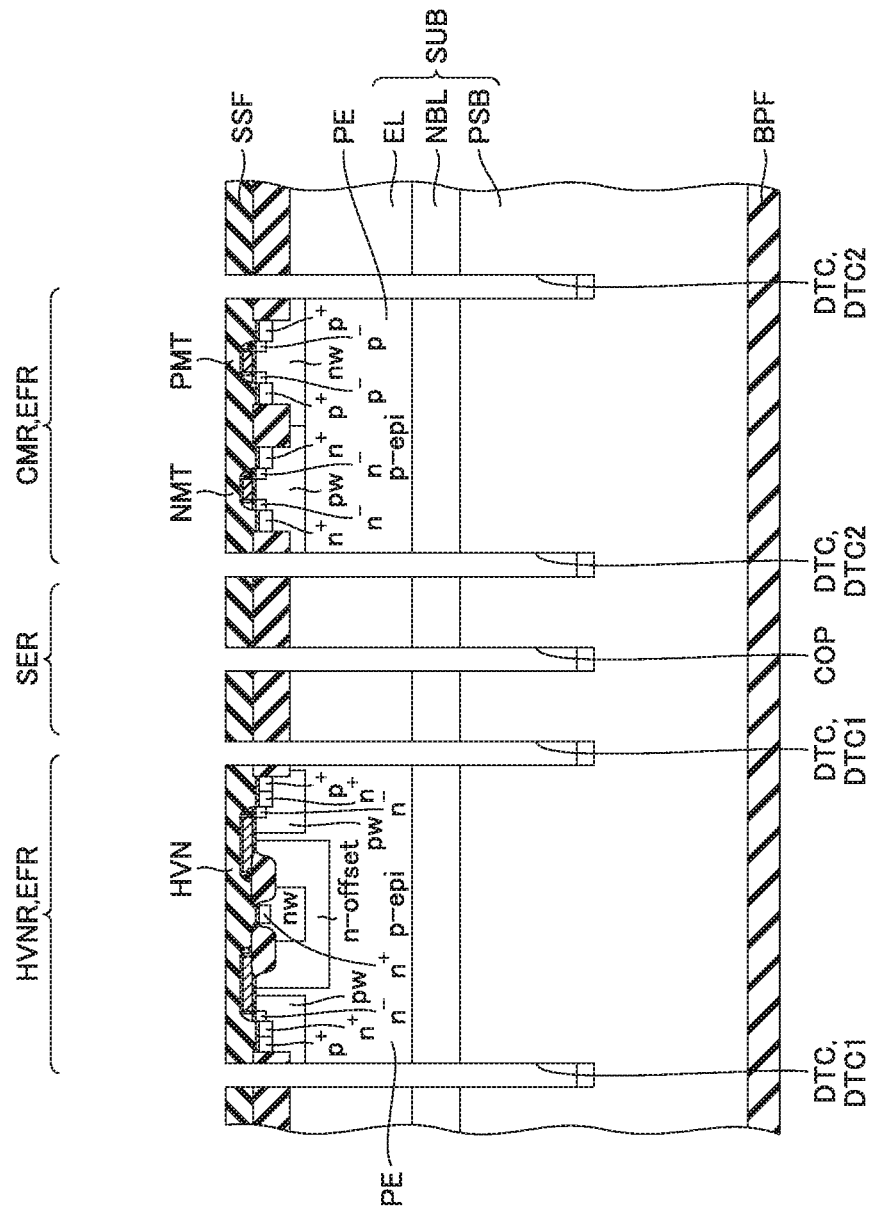
FIG. 6 is a cross-sectional view showing a step performed after the step shown in FIG. 5 in the first embodiment.

Next, as shown in FIG. 6, using silicon oxide film SSF and the like as an etching mask, the exposed p-type epitaxial layer PE is further etched to form a trench DTC1 reaching p-type substrate PSB in high voltage NMOS transistor formation region HVNR. A trench DTC2 reaching p-type substrate PSB is formed in CMOS transistor formation region CMR. An opening COP reaching p-type substrate PSB is formed in substrate electrode region SER.

Figure 7:
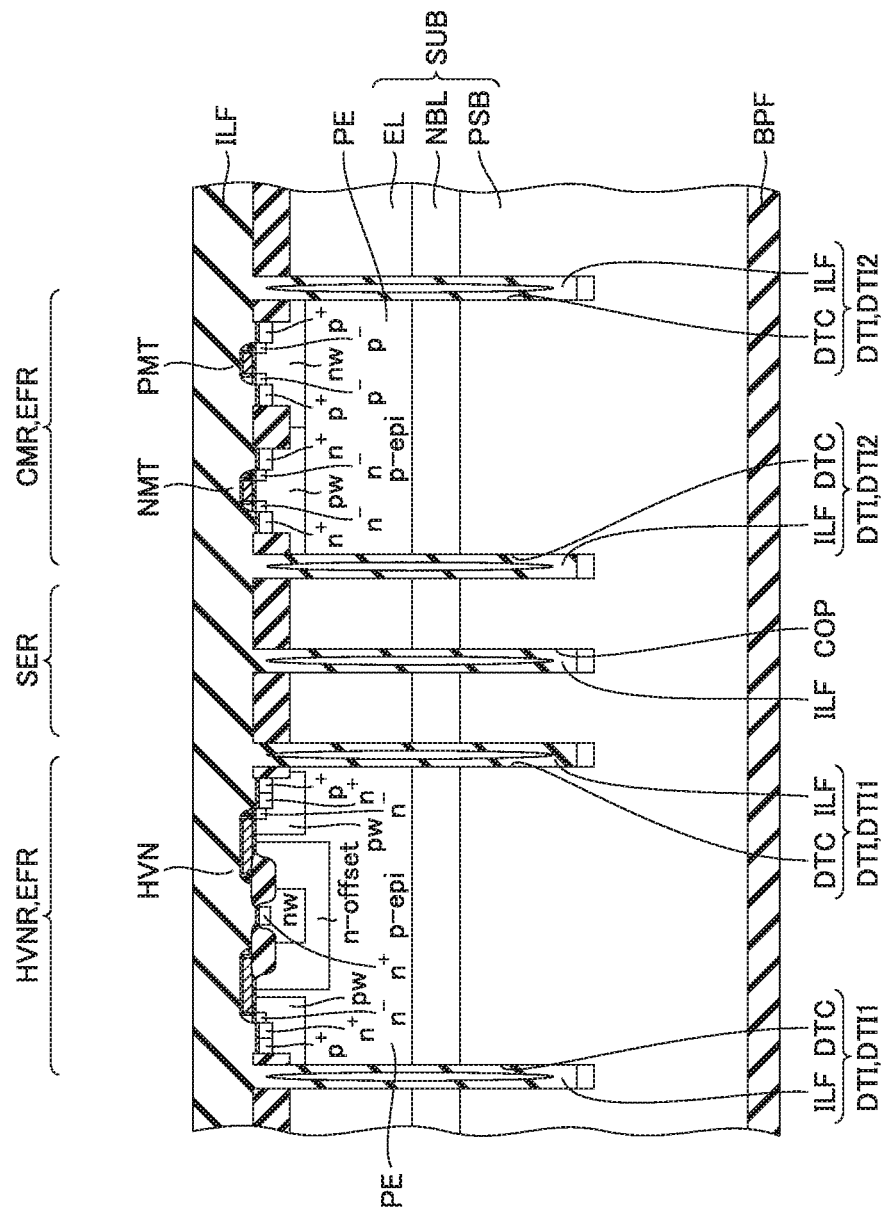
FIG. 7 is a cross-sectional view showing a step performed after the step shown in FIG. 6 in the first embodiment.

Next, a liner film (not shown), for example, formed of a silicon nitride film is formed so as to cover high voltage NMOS transistor HVN, NMOS transistor NMT, PMOS transistor PMT, and the like. Next, as shown in FIG. 7, an insulating film ILF, for example, such as a silicon oxide film is formed so as to cover high voltage NMOS transistor HVN, NMOS transistor NMT, PMOS transistor PMT, and the like.

Here, in high voltage NMOS transistor formation region HVNR, insulating film ILF is formed so as to cover the side surfaces and the bottom surface of trench TRC1. In CMOS transistor formation region CMR, insulating film ILF is formed so as to cover the side surfaces and the bottom surface of trench TRC2. In substrate electrode region SER, insulating film ILF is formed so as to cover the side surfaces and the bottom surface of opening COP.

Figure 8:
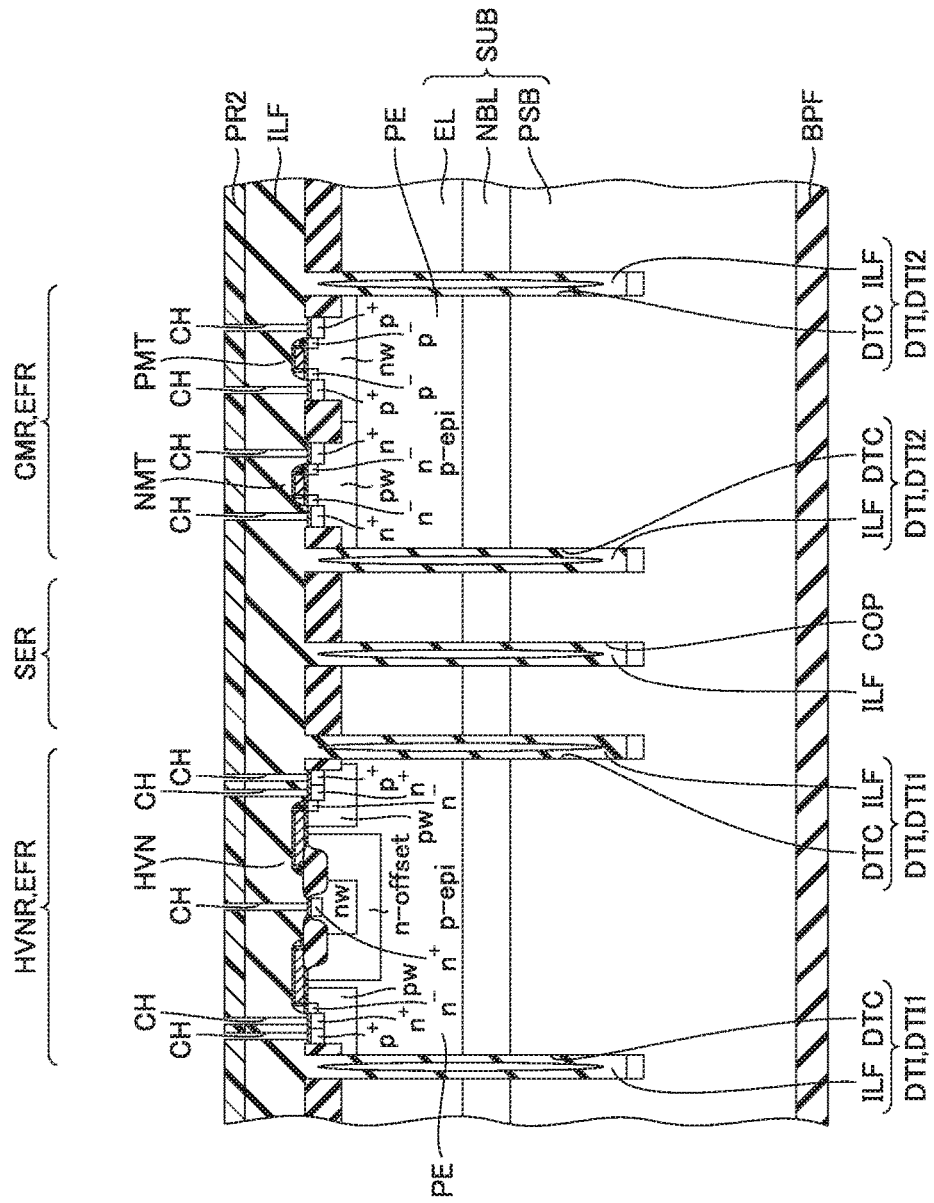
FIG. 8 is a cross-sectional view showing a step performed after the step shown in FIG. 7 in the first embodiment.

Next, as shown in FIG. 8, a predetermined photolithography process is performed to form a resist pattern PR2. Next, using resist pattern PR2 as an etching mask, insulating film ILF is etched to form contact holes CH in each of high voltage NMOS transistor formation region HVNR and CMOS transistor formation region CMR. It is noted that the liner film (not shown) is exposed at the bottom of contact hole CH. Thereafter, resist pattern PR2 is removed.

Figure 9:
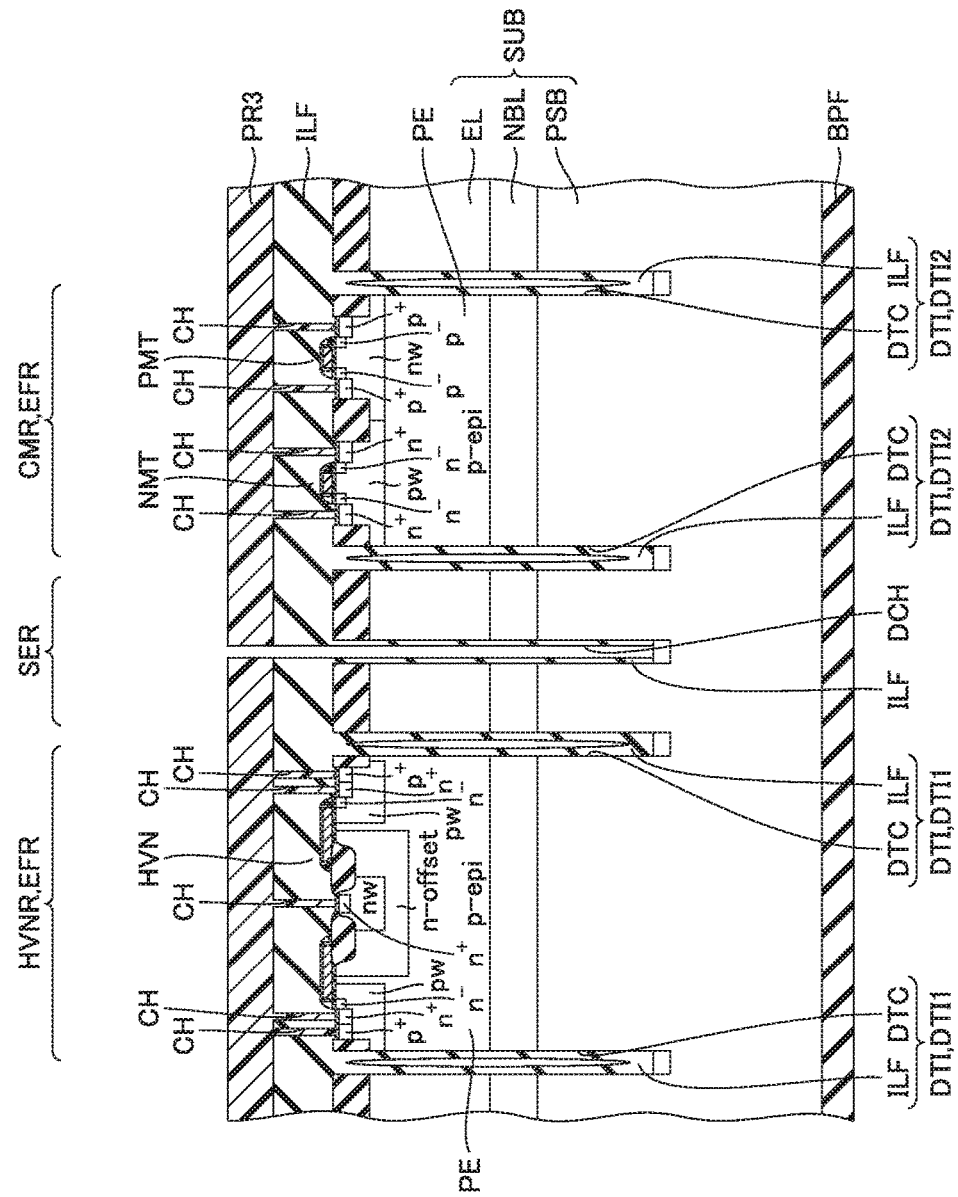
FIG. 9 is a cross-sectional view showing a step performed after the step shown in FIG. 8 in the first embodiment.
Figure 10:
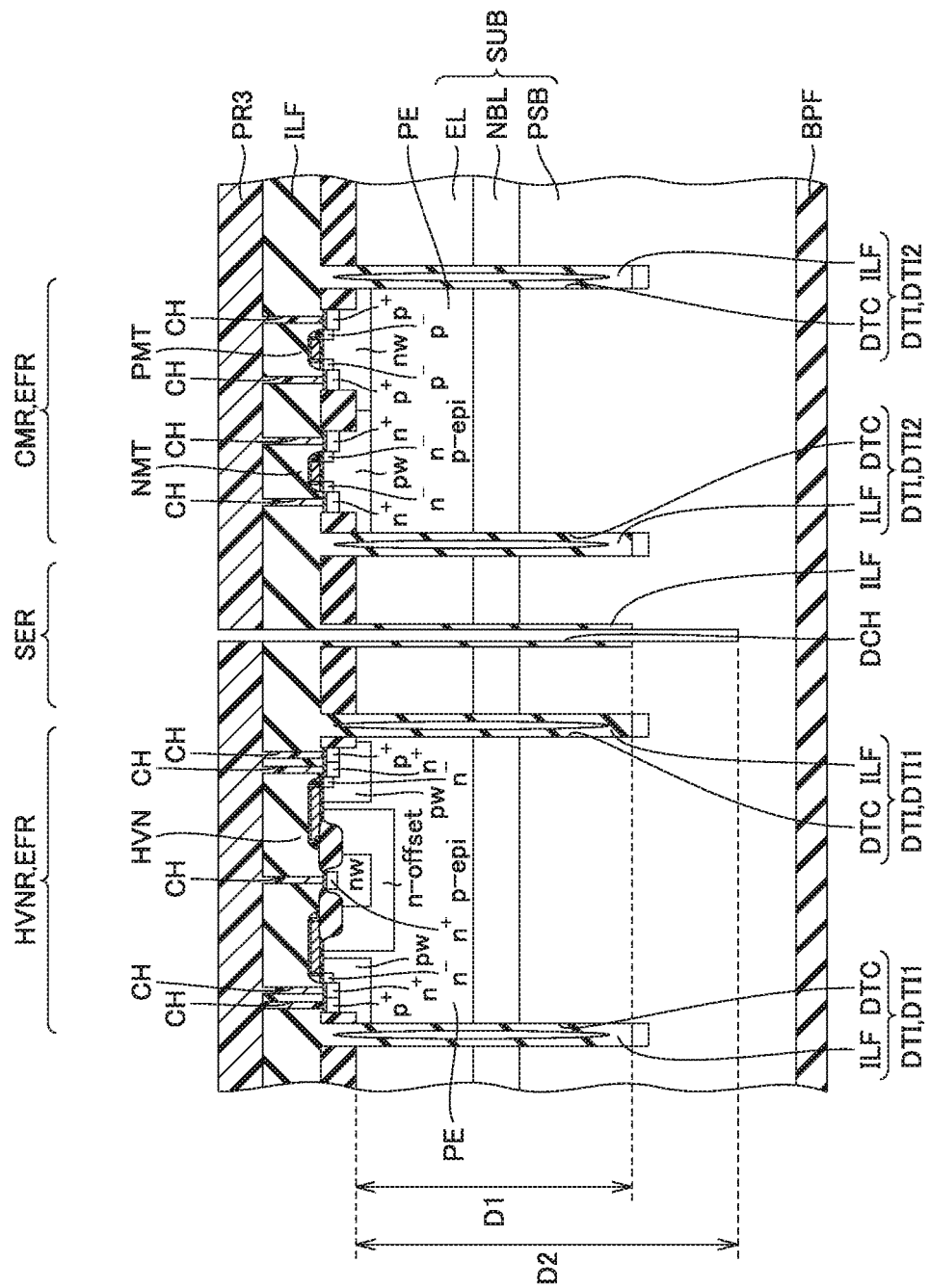
FIG. 10 is a cross-sectional view showing a step performed after the step shown in FIG. 9 in the first embodiment.

Next, as shown in FIG. 9, a predetermined photolithography process is performed to form a resist pattern PR3. Next, using resist pattern PR3 as an etching mask, insulating film ILF is etched to expose p-type substrate PSB (semiconductor substrate SUB). Subsequently, etching is performed to form a contact groove DCH deeper than trenches TRC1, TRC2, as shown in FIG. 10. Thereafter, resist pattern PR3 is removed.

Figure 11:
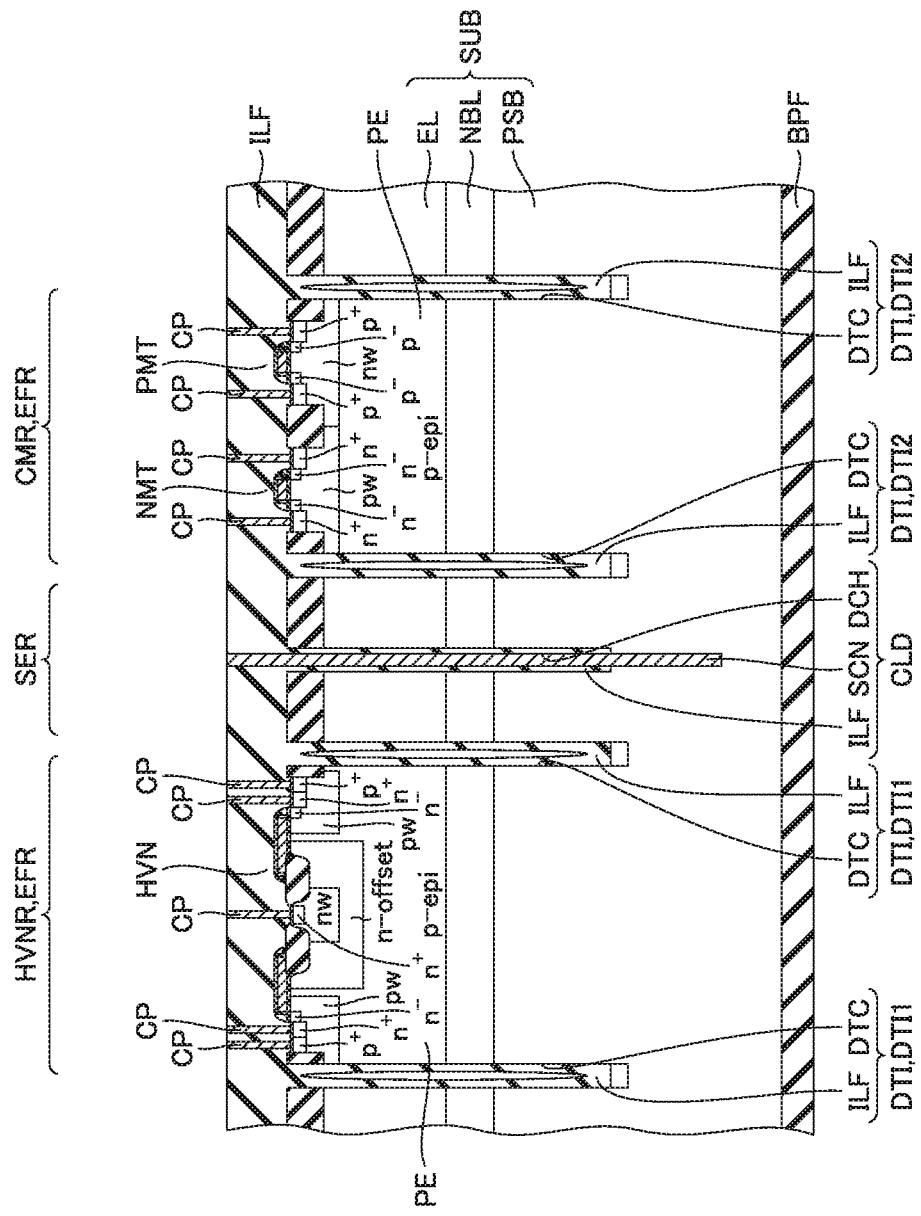
FIG. 11 is a cross-sectional view showing a step performed after the step shown in FIG. 10 in the first embodiment.

Next, the liner film exposed at the bottom of contact hole CH is removed. Next, a barrier metal film (not shown) and a metal film such as a tungsten film (not shown) are formed. Next, the metal film and the like are etched back or undergo chemical mechanical polishing. This process forms contact plugs CP in each of high voltage NMOS transistor formation region HVNR and CMOS transistor formation region CMR, as shown in FIG. 11. In substrate electrode region SER, a conductor portion SCN is formed.

Figure 12:
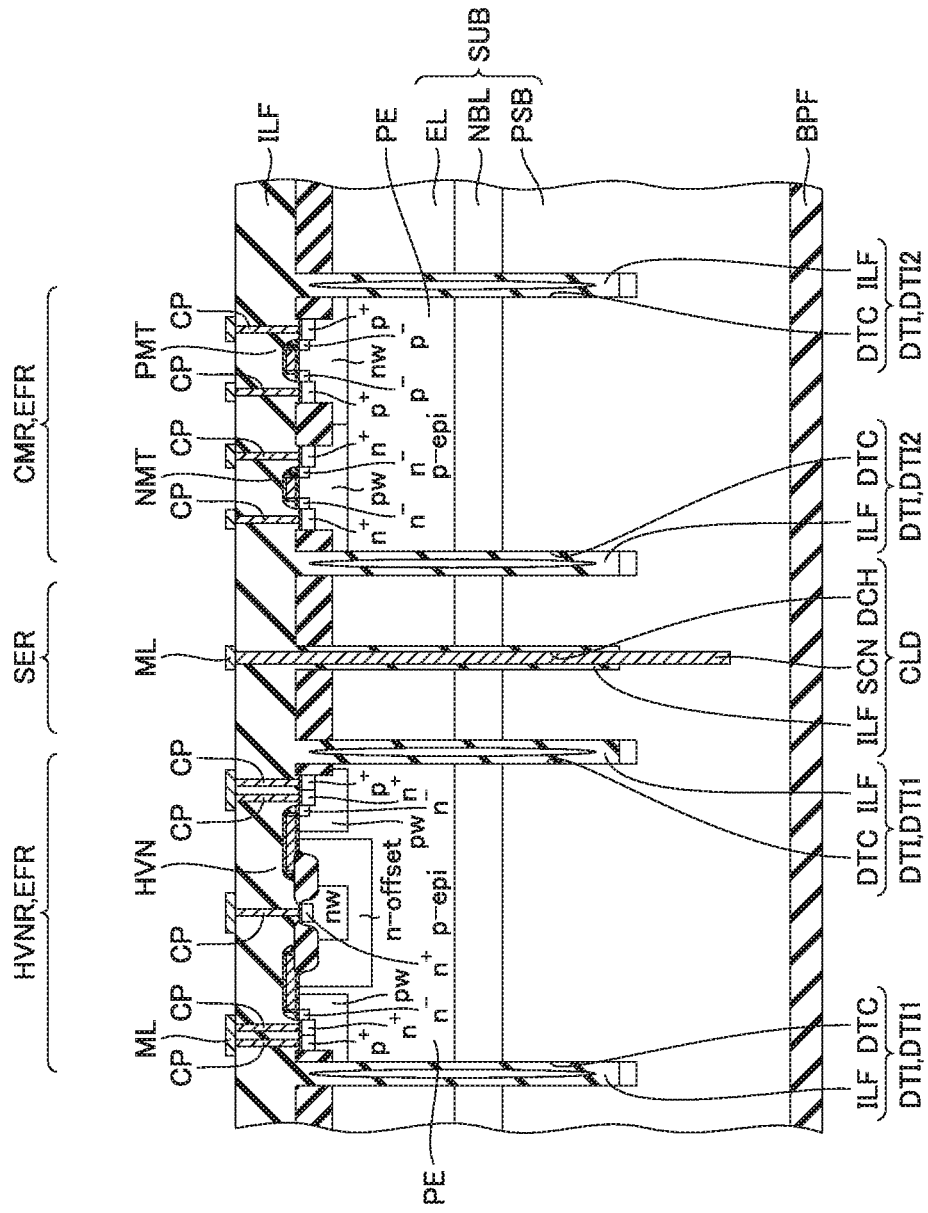
FIG. 12 is a cross-sectional view showing a step performed after the step shown in FIG. 11 in the first embodiment.
Figure 13:
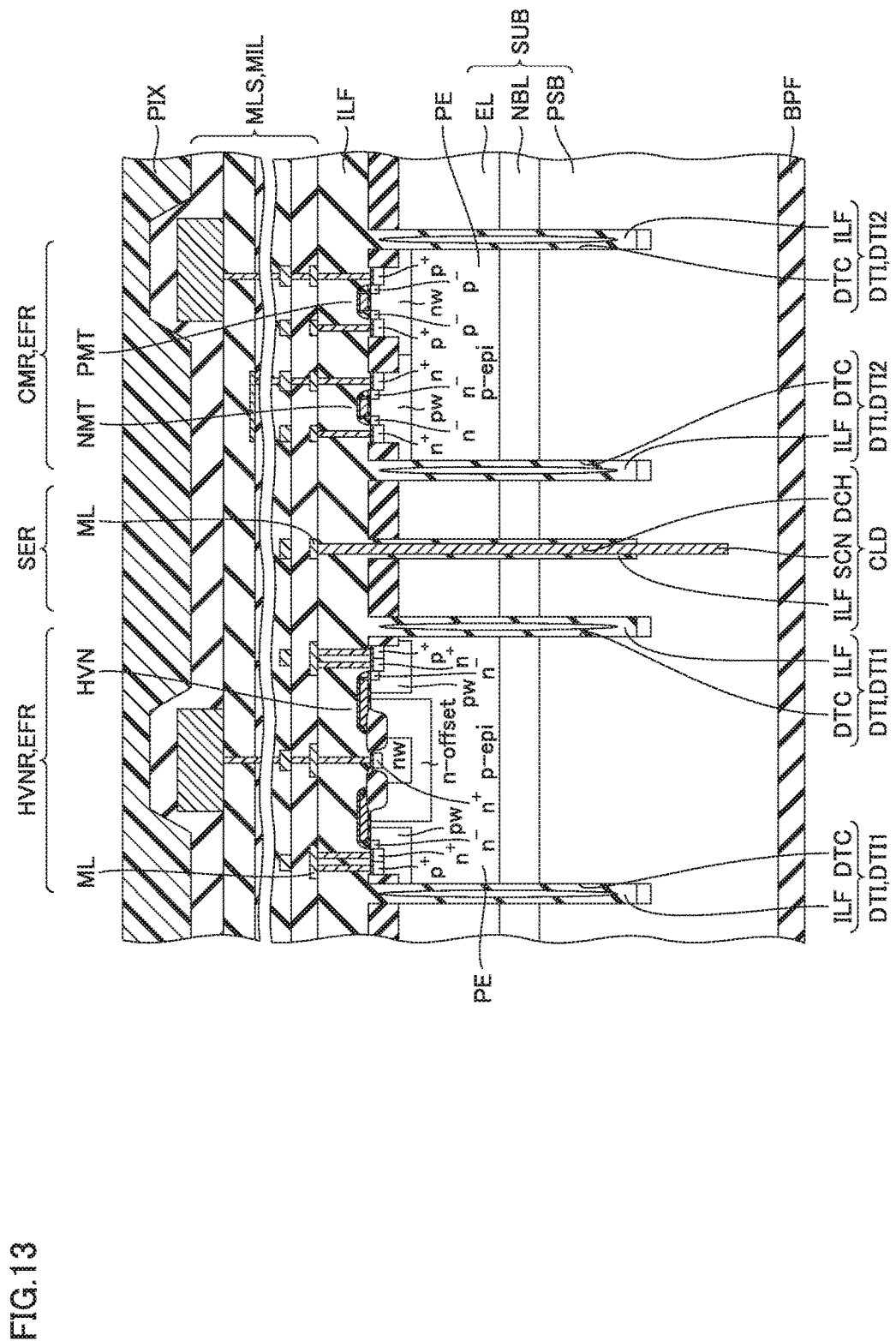
FIG. 13 is a cross-sectional view showing a step performed after the step shown in FIG. 12 in the first embodiment.

Next, as shown in FIG. 12, a plurality of first interconnection layers ML are formed on the surface of insulating film ILF. First interconnection layer ML may be an aluminum interconnection layer or copper wiring. Next, as shown in FIG. 13, the overlying multi-level interconnection layer MLS and multi-level interlayer insulating film MIL are formed as necessary. Thereafter, a polyimide film PIX is formed so as to cover multi-level interlayer insulating film MIL and the like. The main part of the semiconductor device is thus completed.

In the semiconductor device described above, conductor portion SCN of substrate contact portion CLD is formed in contact with p-type substrate PSB (semiconductor substrate SUB). This can suppress the effect of carriers generated from a semiconductor element formed in one element formation region EFR on the operation of a semiconductor element formed in another element formation region EFR. This will be described in comparison with a semiconductor device according to a comparative example.

Figure 14:
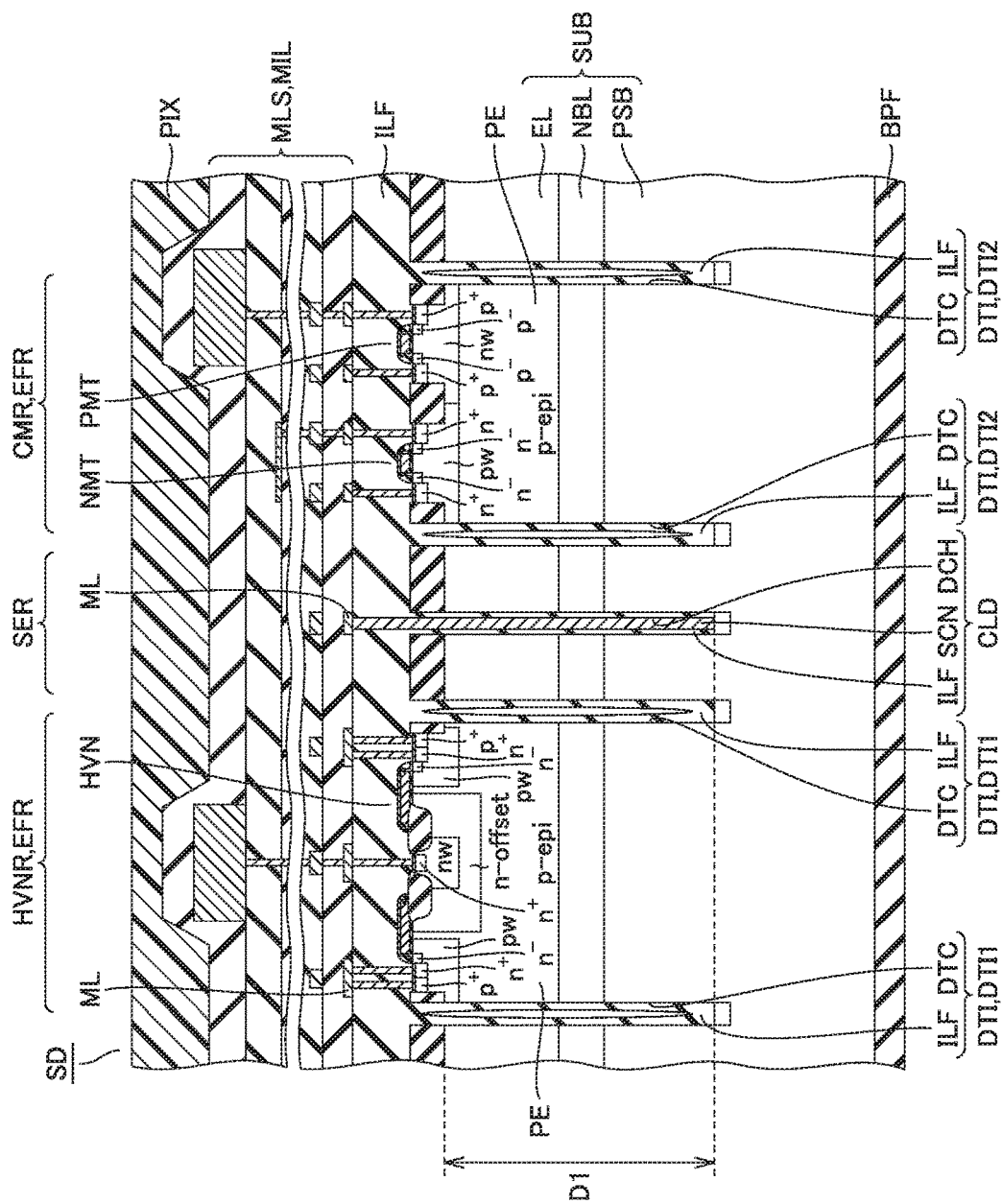
FIG. 14 is a cross-sectional view of a semiconductor device according to a comparative example.

As shown in FIG. 14, in a semiconductor device SD according to a comparative example, contact groove DHC and trenches DTC1, DTC2 are formed to have the same depth. Thus, substrate contact portion CLD is formed from the surface of semiconductor substrate SUB over depth D1, and element isolation insulating films DTI1, DTI2 are also formed from the surface of semiconductor substrate SUB over depth D1. Except for this, the configuration is similar to the configuration of the semiconductor device shown in FIG. 3. Therefore, the same parts are denoted with the same reference signs and a description thereof is not repeated unless necessary.

In general, in a semiconductor device, generation and annihilation of carriers (electrons or holes) are repeated in connection with the operation of semiconductor elements. The generated carriers are annihilated at micro-defects (BMD) produced in the semiconductor substrate as the recombination center. The micro-defects depend on the concentration of oxygen introduced to semiconductor substrate SUB (p-type substrate PSB). As the oxygen concentration decreases, the micro-defects decrease. As micro-defects decrease, the recombination center of carriers decreases.

Figure 15:
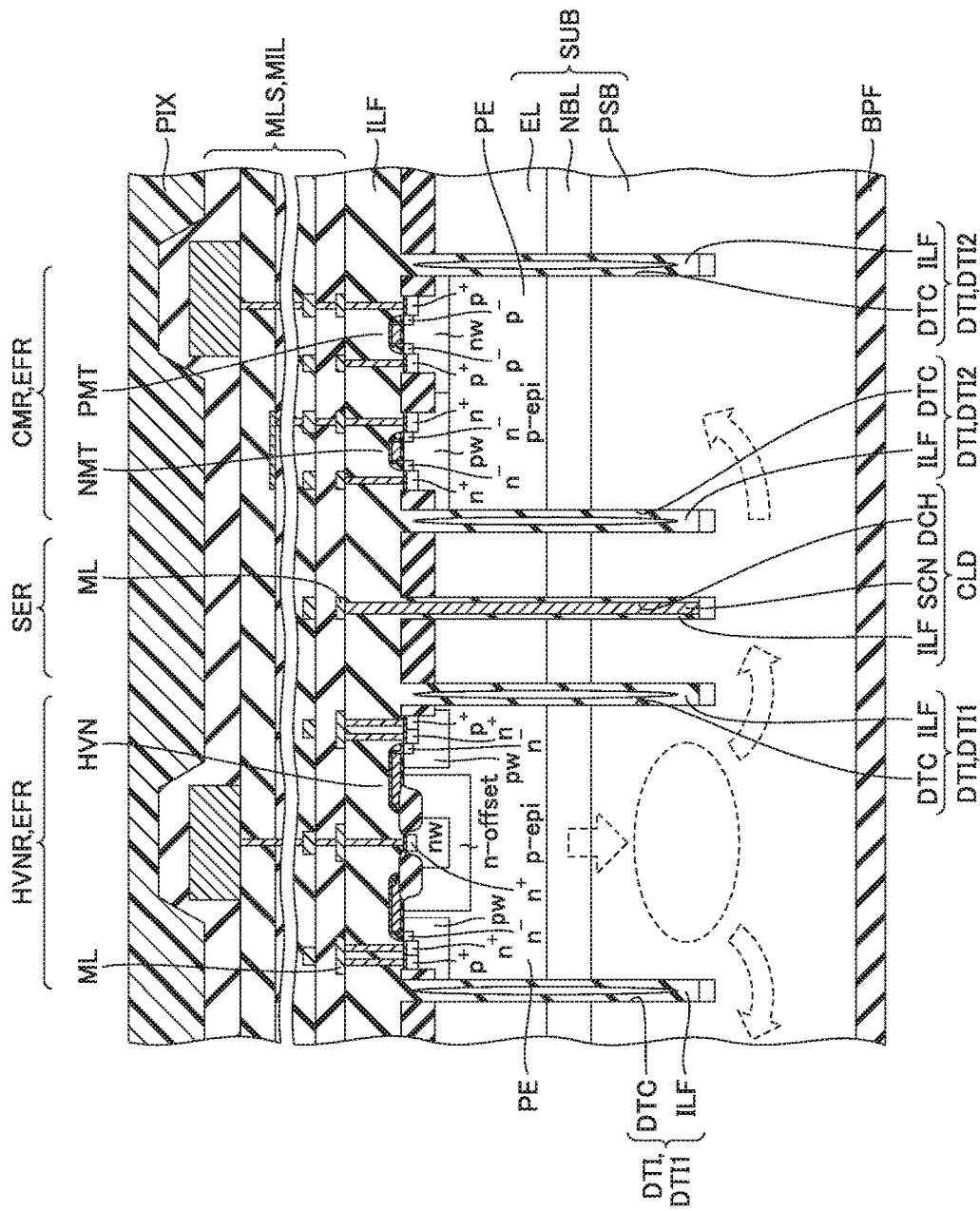
FIG. 15 is a cross-sectional view for explaining the problem of the semiconductor device according to the comparative example.

Here, it is supposed that carriers (electrons) are generated in connection with the operation of high voltage NMOS transistor NMT in semiconductor device SD according to the comparative example. As shown in FIG. 15, carriers (electrons) generated from high voltage NMOS transistor NMT are injected into p-type substrate PSB (see the dotted arrow). The carriers injected into p-type substrate PSB diffuse in p-type substrate PSB as substrate leak current. The carriers diffusing in p-type substrate PSB are, for example, recombined and annihilated in the micro-defects produced in p-type substrate PSB and thereby reduced.

At this time, if the number of micro-defects in p-type substrate PSB decreases, the proportion of annihilated carriers decreases, and the lifetime of carriers becomes long. If the lifetime of carriers becomes long, the carriers may further diffuse in p-type substrate PSB to reach, for example, the region of p-type substrate PSB positioned at the adjacent CMOS transistor formation region CMR (see the dotted arrow). The inventors of the present invention have observed that the carriers reaching the adjacent region may cause malfunction of NMOS transistor NMT or PMOS transistor PMT.

By contrast to semiconductor device SD according to the comparative example, semiconductor device SD according to the embodiment has substrate contact portion CLD formed between high voltage NMOS transistor formation region HVNR and CMOS transistor formation region CMR. Substrate contact portion CLD is formed further to a region deeper than element isolation insulating film DTI so that conductor portion SCN of substrate contact portion CLD is in contact with p-type substrate PSB.

Figure 16:
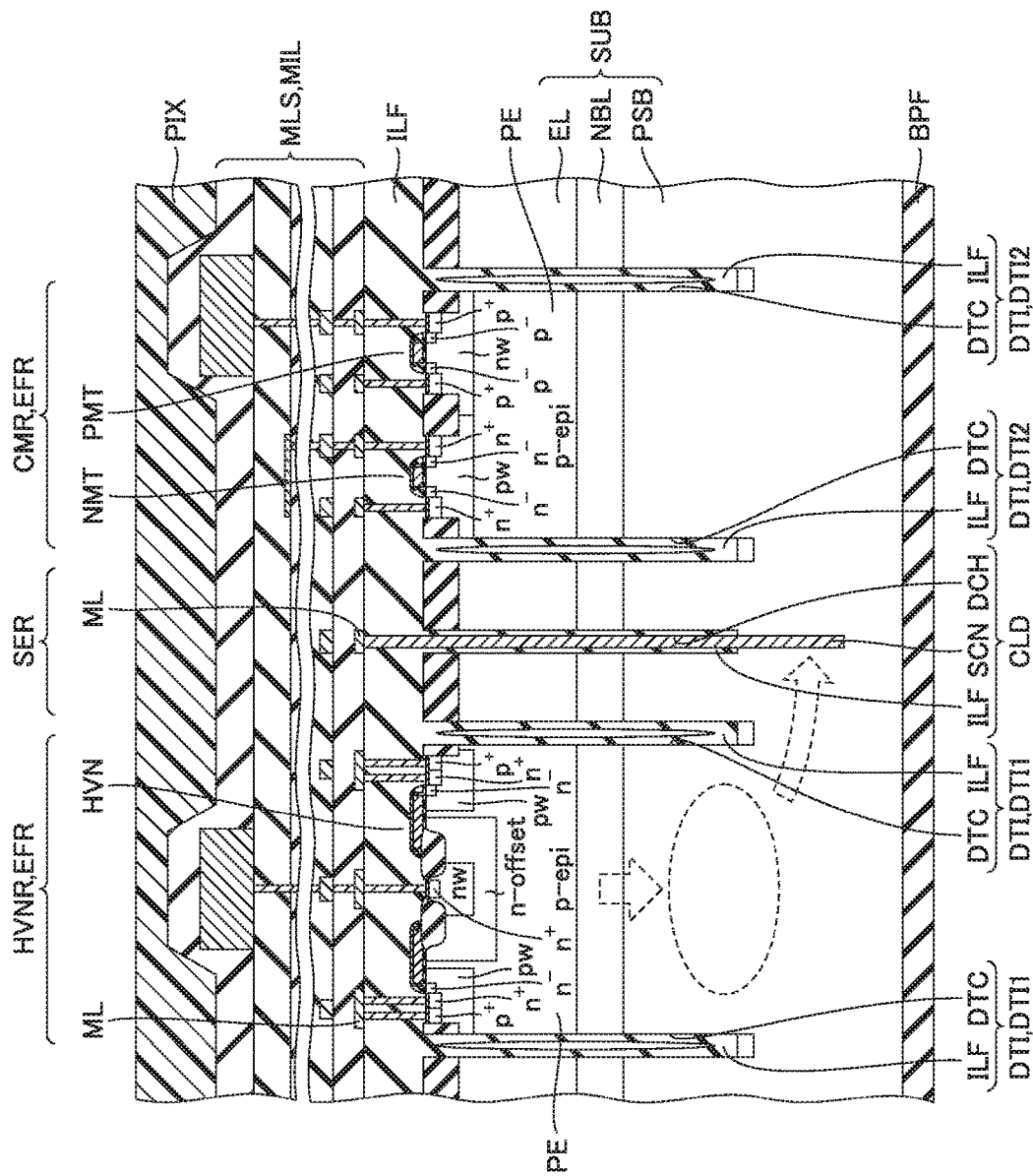
FIG. 16 is a cross-sectional view for explaining the operation effects of the semiconductor device in the first embodiment.
Figure 17:
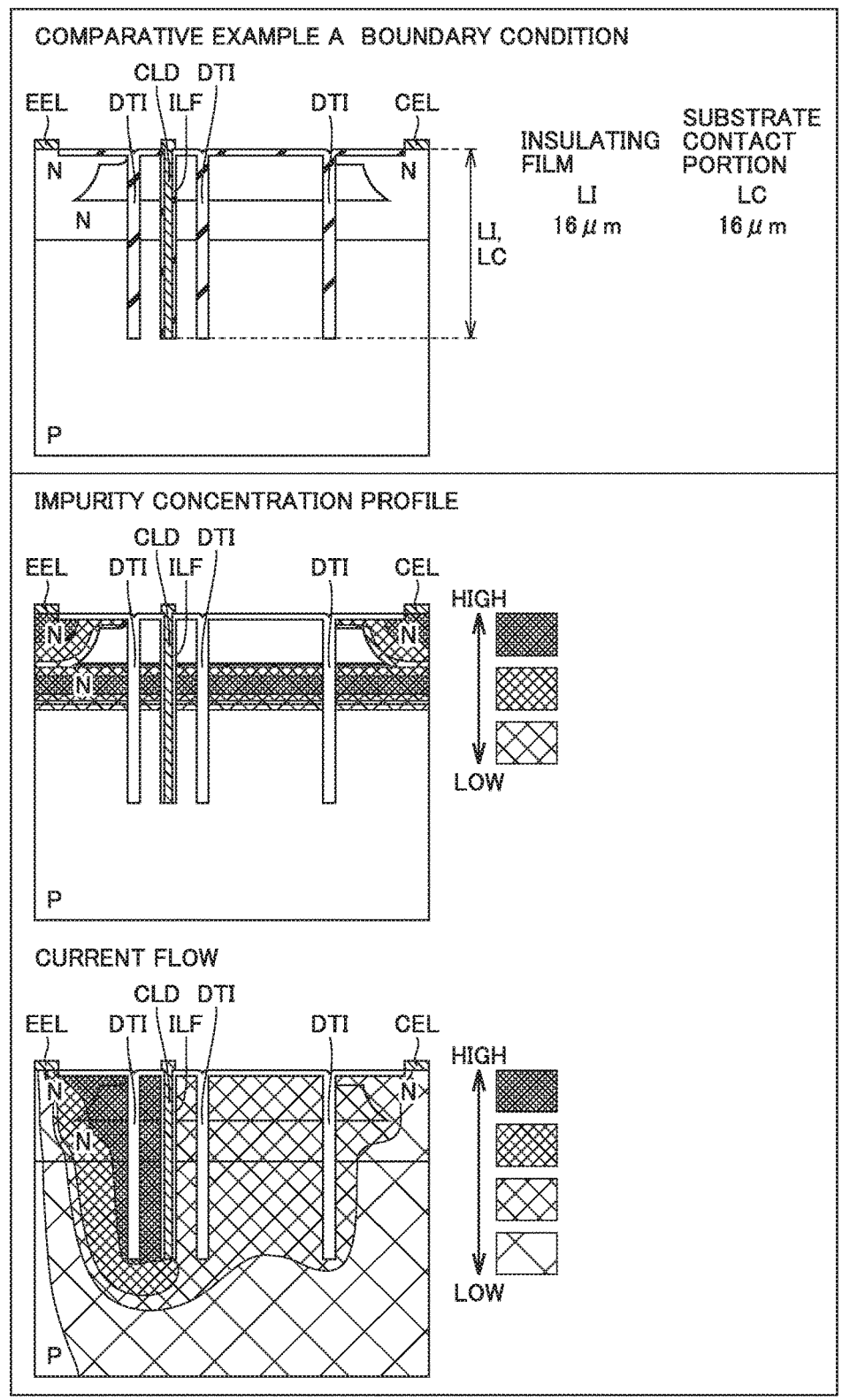
FIG. 17 is a first diagram for explaining evaluation by simulation of the semiconductor device serving as a comparative example in the first embodiment.

Accordingly, as shown in FIG. 16, the carriers diffusing toward CMOS transistor formation region CMR in p-type substrate PSB flow through conductor portion SCN. Since the carriers flow through conductor portion SCN, the carriers flowing toward CMOS transistor formation region CMR are significantly reduced, thereby suppressing malfunction of NMOS transistor NMT or PMOS transistor PMT. This will be discussed based on the simulation conducted by the inventors of the present invention. The results are shown in FIG. 17 (Comparative Example A), FIG. 18 (Comparative Example B), FIG. 19 (Embodiment A), and FIG. 20 (Embodiment B).

The inventors of the present invention designated a semiconductor element that emits carriers, such as the above-noted high voltage NMOS transistor HVN, as an emitter electrode EEL, and designated a semiconductor element that carriers flow into, such as NMOS transistor NMT or PMOS transistor PMT, as a collector electrode CEL. The inventors of the present invention then evaluated by what degree the carriers (electrons) emitted from emitter electrode EEL reach collector electrode CEL.

First of all, the comparative examples will be described. The upper section of FIG. 17 shows the boundary condition of Comparative Example A, and the middle section shows the impurity concentration profile. In Comparative Example A, the depth of element isolation insulating film DTI from the surface of the semiconductor substrate was set to 16 µm. Furthermore, depth LC of substrate contact portion CLD (conductor portion) from the surface of the semiconductor substrate was set to 16 µm. Length L1 of the insulating film covering the conductor portion from the surface of the semiconductor substrate was set to 16 µm.

In the impurity profile, the n-type impurity concentration is mainly represented by the density of cross-hatching. The higher the density of cross-hatching is, the higher the n-type impurity concentration is.

The lower section of FIG. 17 shows the simulation result of current flow. The level of current flow is illustrated by the density of cross-hatching. The higher the density of cross-hatching is, the higher the current flow is. As shown in FIG. 17 (lower section), it is understood that carriers (electrons) emitted from emitter electrode EEL diffuse in the semiconductor substrate to reach collector electrode CEL.

Figure 18:
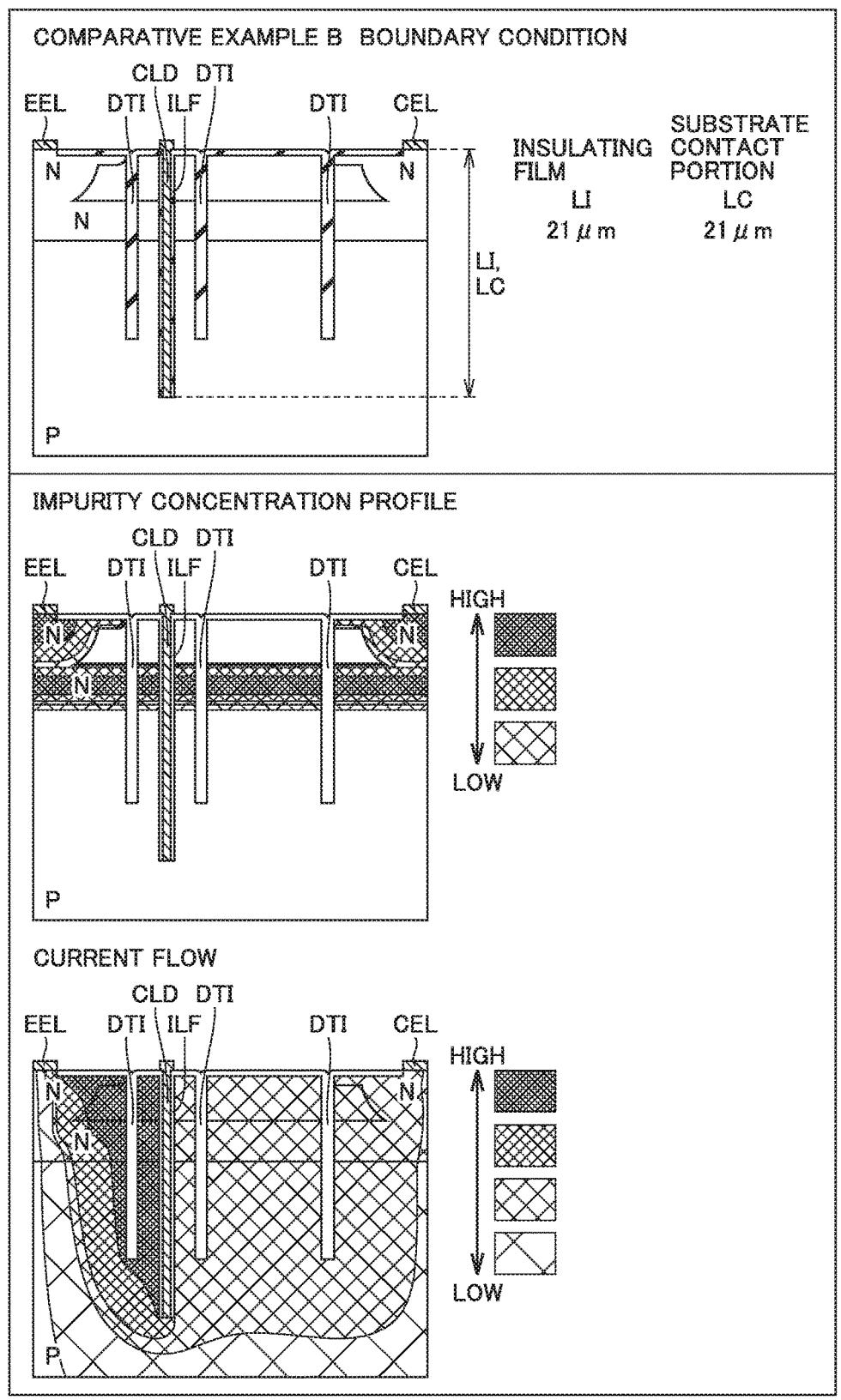
FIG. 18 is a second diagram for explaining evaluation by simulation of the semiconductor device serving as a comparative example in the first embodiment.

Next, the upper section of FIG. 18 shows the boundary condition of Comparative Example B, and the middle section shows the impurity concentration profile. In Comparative Example B, the depth of element isolation insulating film DTI from the surface of the semiconductor substrate was set to 16 µm. Furthermore, depth LC of substrate contact portion CLD (conductor portion) from the surface of the semiconductor substrate was set to 21 µm. Length L1 of the insulating film covering the conductor portion from the surface of the semiconductor substrate was set to 21 µm. In the impurity profile, the n-type impurity concentration is mainly represented by the density of cross-hatching.

The lower section of FIG. 18 shows the simulation result of current flow. The level of current flow is illustrated by the density of cross-hatching. As shown in FIG. 18 (lower section), it is understood that carriers (electrons) emitted from emitter electrode EEL diffuse in the semiconductor substrate in a wider range than in Comparative Example A to reach collector electrode CEL.

Figure 19:
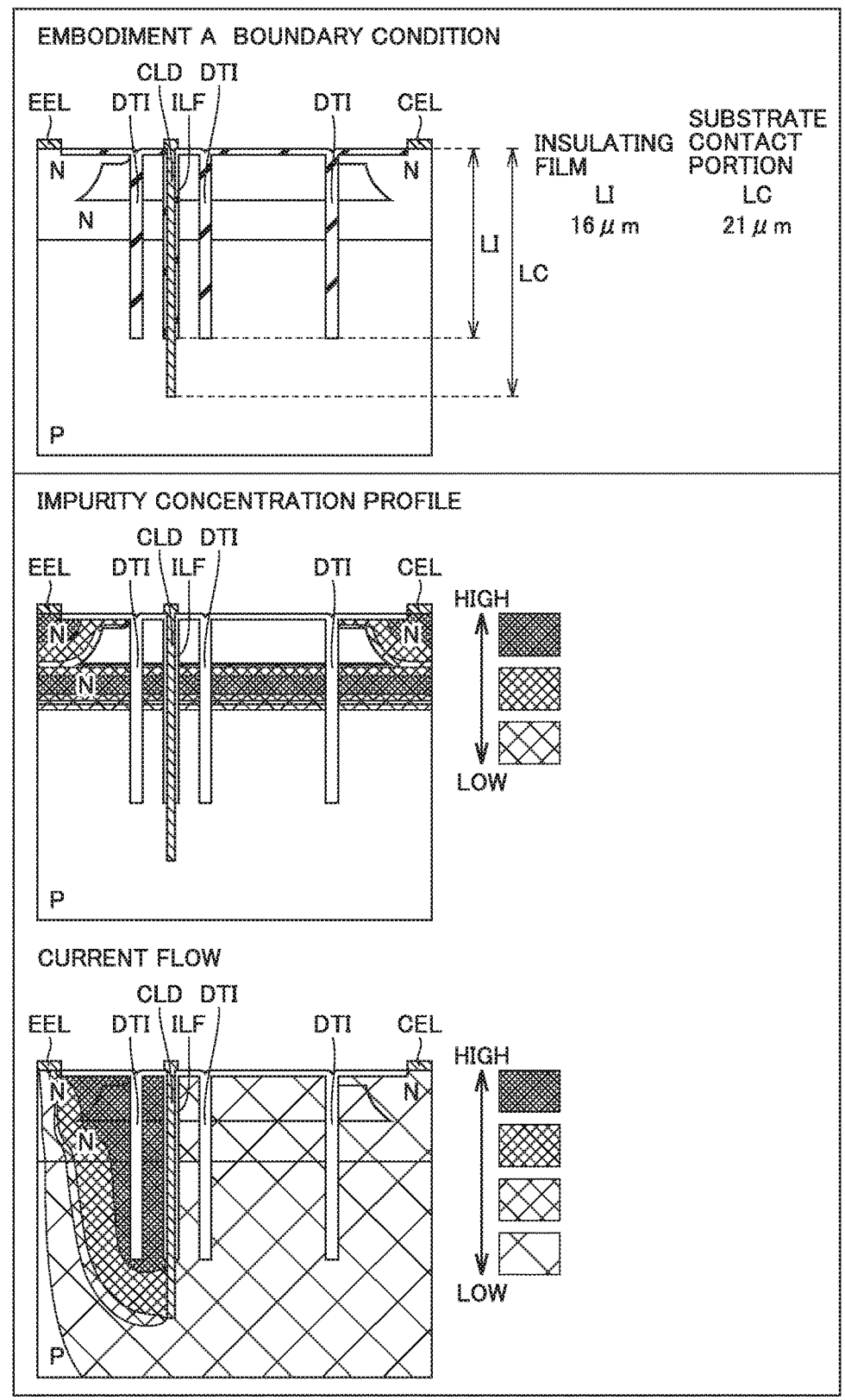
FIG. 19 is a first diagram for explaining evaluation by simulation of the semiconductor device in the first embodiment.

Embodiments will now be described. The upper section of FIG. 19 shows the boundary condition of Embodiment A, and the middle section shows the impurity concentration profile. In Embodiment A, the depth of element isolation insulating film DTI from the surface of the semiconductor substrate was set to 16 µm. Furthermore, depth LC of substrate contact portion CLD (conductor portion) from the surface of the semiconductor substrate was set to 21 µm. Length L1 of the insulating film covering the conductor portion from the surface of the semiconductor substrate was set to 16 µm. In Embodiment A, of substrate contact portion CLD, the conductor portion corresponding to a length of 5 µm is in contact with the semiconductor substrate. In the impurity profile, the n-type impurity concentration is mainly represented by the density of cross-hatching.

The lower section of FIG. 19 shows the simulation result of current flow. The level of current flow is illustrated by the density of cross-hatching. As shown in FIG. 19 (lower section), it is understood that carriers (electrons) emitted from emitter electrode EEL flow into substrate contact portion CLD (conductor portion) in contact with the semiconductor substrate. Therefore, the current flow diffusing in the semiconductor substrate to reach collector electrode CEL is significantly reduced when compared with Comparative Example A and Comparative Example B.

Figure 20:
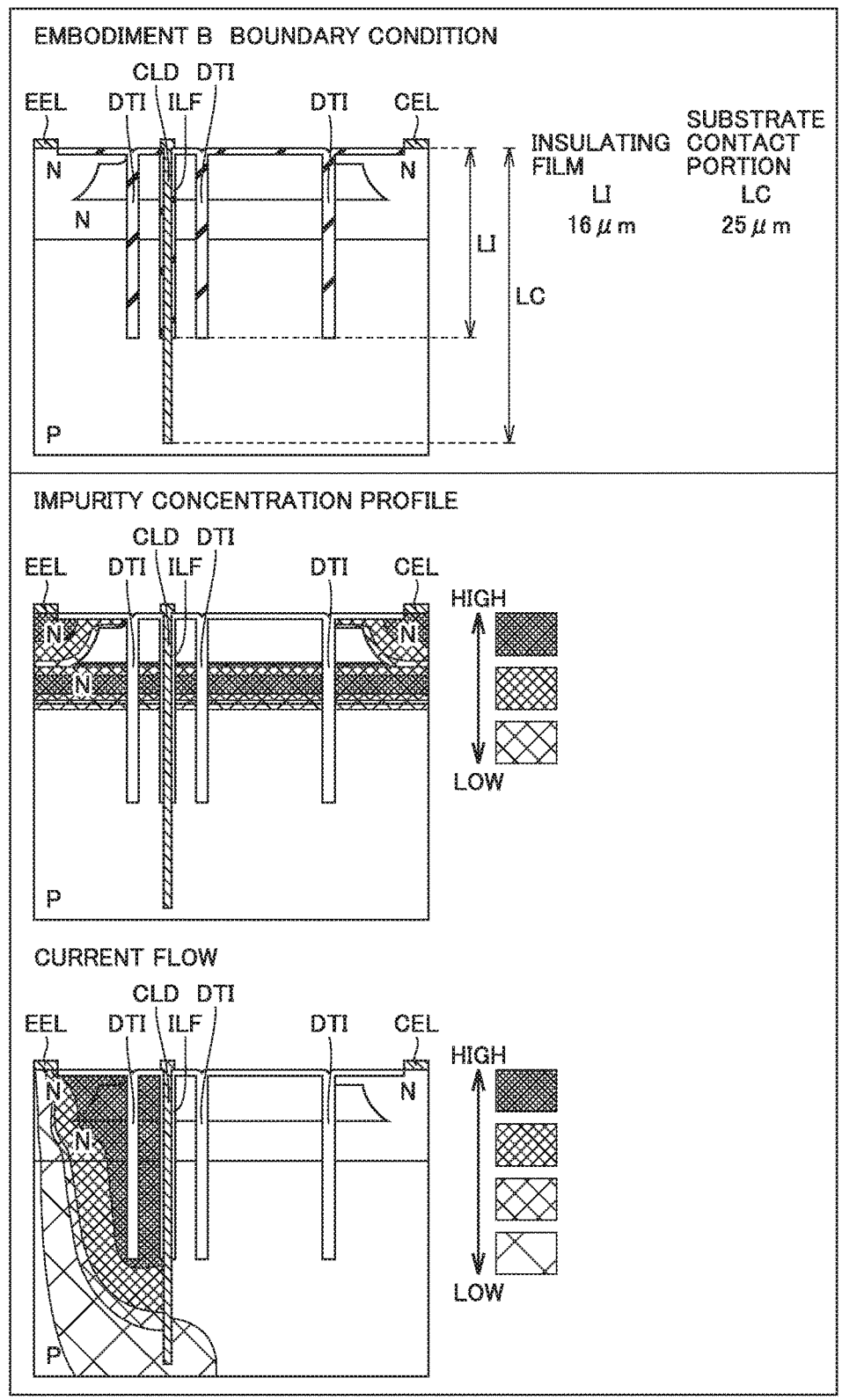
FIG. 20 is a second diagram for explaining evaluation by simulation of the semiconductor device in the first embodiment.

The upper section of FIG. 20 shows the boundary condition of Embodiment B, and the middle section shows the impurity concentration profile. In Embodiment B, the depth of element isolation insulating film DTI from the surface of the semiconductor substrate was set to 16 µm. Furthermore, depth LC of substrate contact portion CLD (conductor portion) from the surface of the semiconductor substrate was set to 25 µm. Length L1 of the insulating film covering the conductor portion from the surface of the semiconductor substrate was set to 16 µm. In Embodiment B, of substrate contact portion CLD, the conductor portion corresponding to a length of 9 µm is in contact with the semiconductor substrate. In the impurity profile, the n-type impurity concentration is mainly represented by the density of cross-hatching.

The lower section of FIG. 20 shows the simulation result of current flow. The level of current flow is shown by the density of cross-hatching. As shown in FIG. 20 (lower section), the length of the conductor portion in contact with the semiconductor substrate is increased whereby more carriers (electrons) emitted from emitter electrode EEL flow into substrate contact portion CLD (conductor portion) in contact with the semiconductor substrate, when compared with Embodiment A. It is therefore understood that the current flow diffusing in the semiconductor substrate to reach collector electrode CEL is further reduced when compared with Embodiment A.

Figure 21:
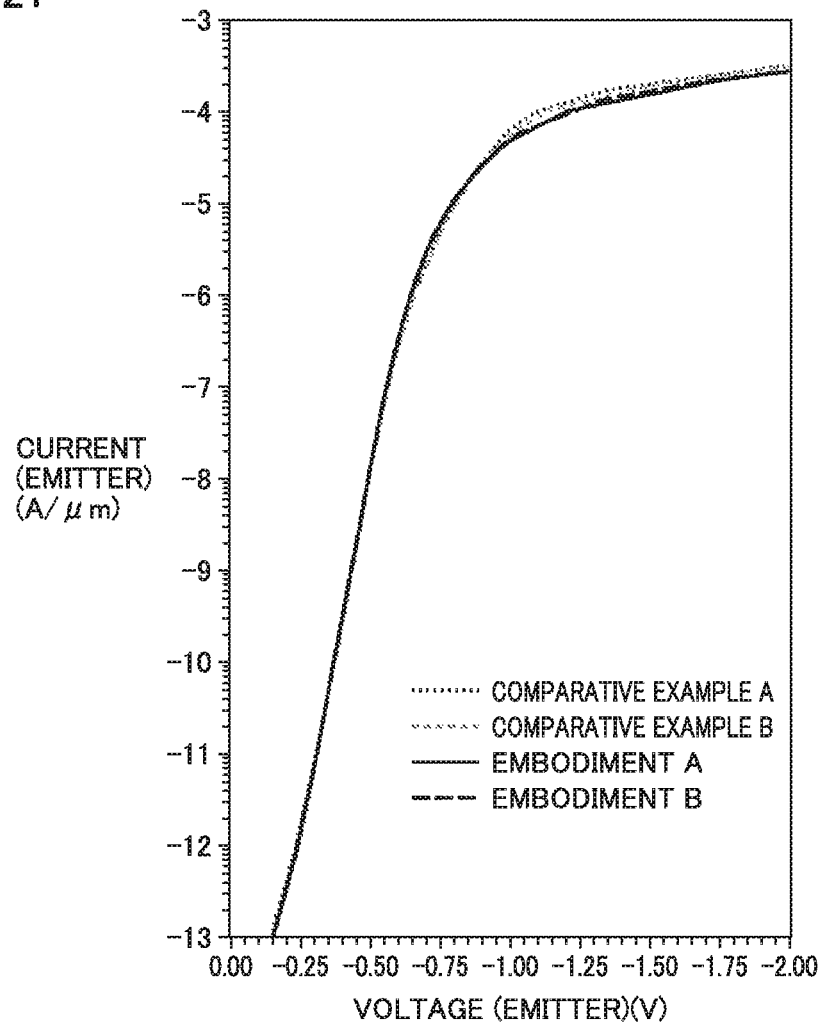
FIG. 21 is a third diagram for explaining evaluation by simulation of the semiconductor device in the first embodiment.

The IV (current and voltage) waveform in each of Comparative Example A, Comparative Example B, Embodiment A, and Embodiment B will now be described. First of all, FIG. 21 shows the relation between voltage applied to emitter electrode EEL and current flowing through emitter electrode EEL. The horizontal axis represents voltage. The vertical axis represents current in logarithm expression.

Figure 22:
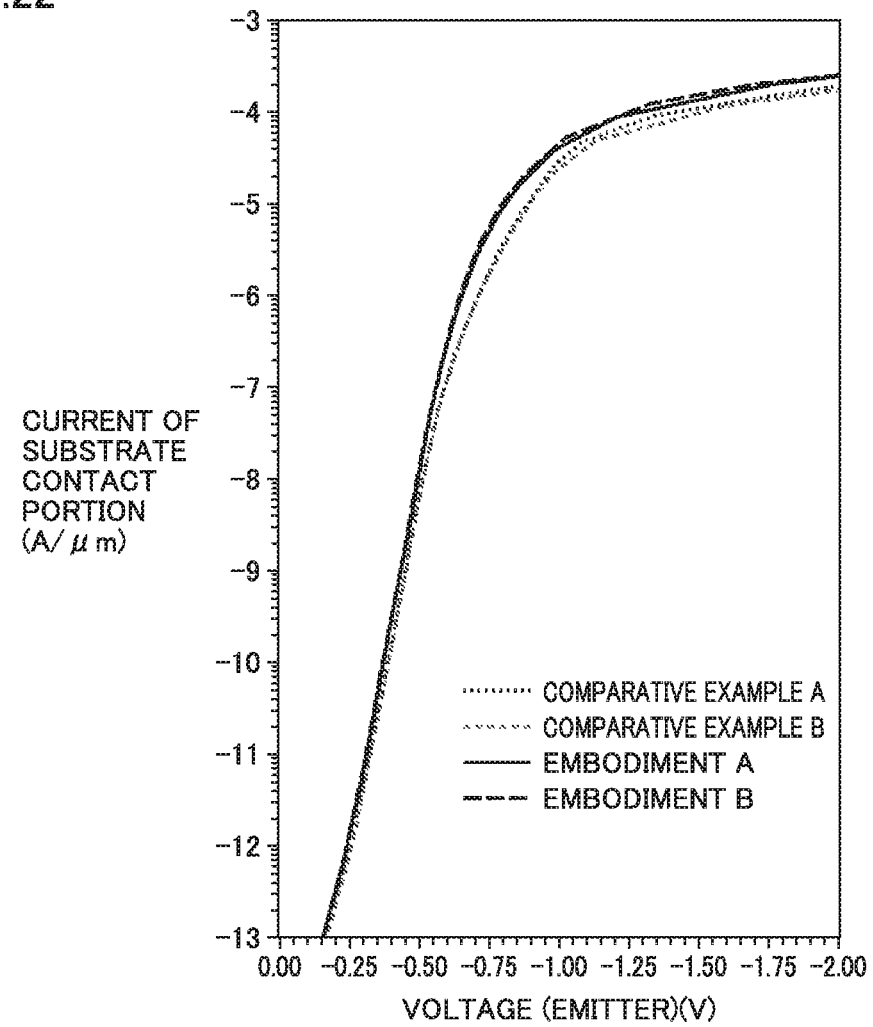
FIG. 22 is a fourth diagram for explaining evaluation by simulation of the semiconductor device in the first embodiment.

FIG. 22 shows the simulation result of current flowing through the substrate contact portion when voltage and current shown in FIG. 21 are applied to the emitter electrode. The horizontal axis represents voltage. The vertical axis represents current flowing through substrate contact portion CLD, that is, current diffusing from the emitter electrode in the semiconductor substrate to reach substrate contact portion CLD.

In conductor portion SCN of substrate contact portion CLD in Comparative Example A and Comparative Example B, the bottom surface of conductor portion SCN is in contact with the semiconductor substrate. In conductor portion SCN of Embodiment A, the portion of conductor portion SCN corresponding to a length of 5 μm is in contact with the semiconductor substrate. In conductor portion SCN of Embodiment B, the portion of conductor portion SCN corresponding to a length of 9 μm is in contact with the semiconductor substrate.

It is therefore understood that, in Comparative Example A and Comparative Example B having a small contact area between substrate contact portion CLD (conductor portion SCN) and the semiconductor substrate, less current flows through substrate contact portion CLD, when compared with Embodiment A and Embodiment B having a large contact area.

Figure 23:
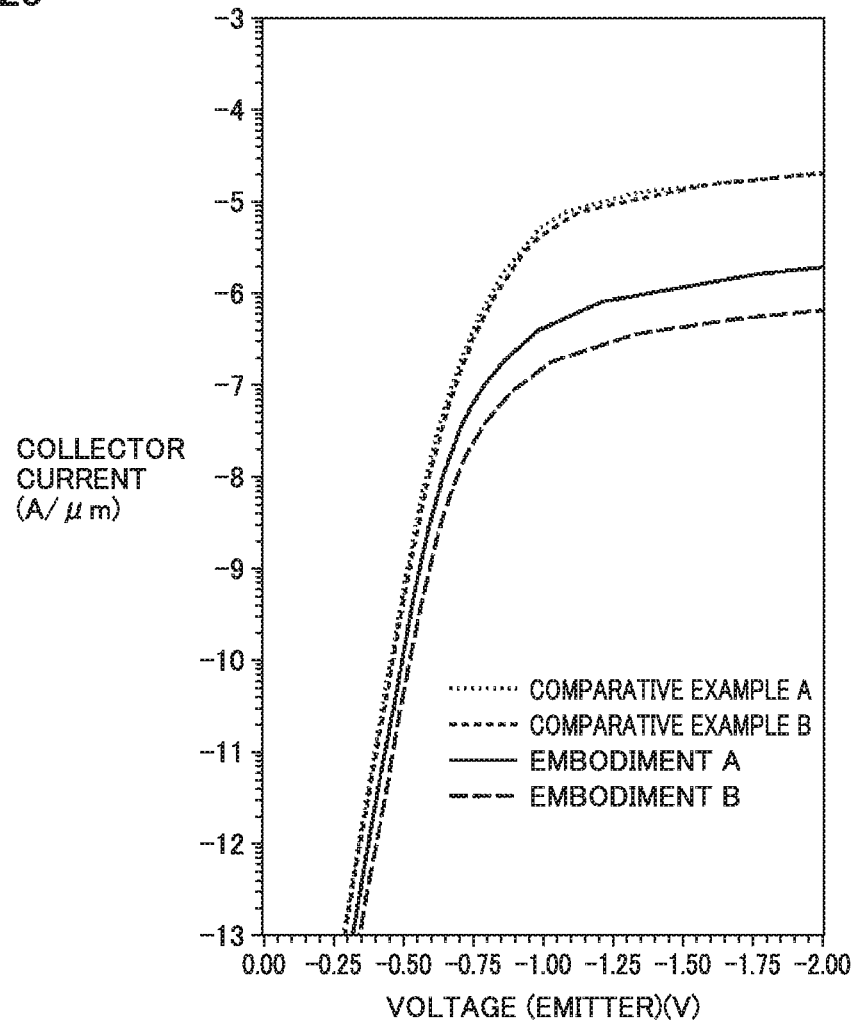
FIG. 23 is a fifth diagram for explaining evaluation by simulation of the semiconductor device in the first embodiment.

FIG. 23 shows the simulation result of current flowing through the collector electrode when voltage and current shown in FIG. 21 are applied to the emitter electrode. The horizontal axis represents voltage. The horizontal axis represents voltage. The vertical axis represents current flowing through collector electrode CEL, that is, current diffusing from emitter electrode EEL in the semiconductor substrate to reach collector electrode CEL.

When compared with Comparative Example A and Comparative Example B, in Embodiment A having a large contact area, the component of current that diffuses from emitter electrode EEL in the semiconductor substrate to reach substrate contact portion CLD is increased. Thus, current diffusing in the semiconductor substrate to reach the collector electrode is reduced by the amount flowing through substrate contact portion CLD. In Embodiment B having an even larger contact area than Embodiment A, the component of current that diffuses from emitter electrode EEL in the semiconductor substrate to reach substrate contact portion CLD is further increased. It is therefore understood that current that reaches the collector electrode is further reduced.

This evaluation result has revealed that increasing the contact area of conductor portion SCN of substrate contact portion CLD with the semiconductor substrate enables current (carriers) diffusing from emitter electrode EEL in the semiconductor substrate to flow through substrate contact portion CLD and reduces current (carriers) reaching the collector electrode by the amount flowing through substrate contact portion CLD. That is, it has been found that the effect of carriers generated in one semiconductor element on another semiconductor element as leak current can be suppressed.

In addition to increasing the contact area between the substrate contact portion and the semiconductor substrate (approach A), another possible approach for suppressing the effect of carriers generated in one semiconductor element on another semiconductor element as leak current is to increase the distance between one semiconductor element and another semiconductor element (approach B). The inventors of the present invention then compared approach A with approach B.

First of all, of current (IE) flowing from the emitter electrode, the proportion of current (IC) flowing into the collector electrode is defined as α (IC/IE). The dependency of α on the length (depth) of the substrate contact portion and the dependency of α on the distance between the emitter electrode and the collector electrode were evaluated. The result is shown in FIG. 24.

Figure 24:
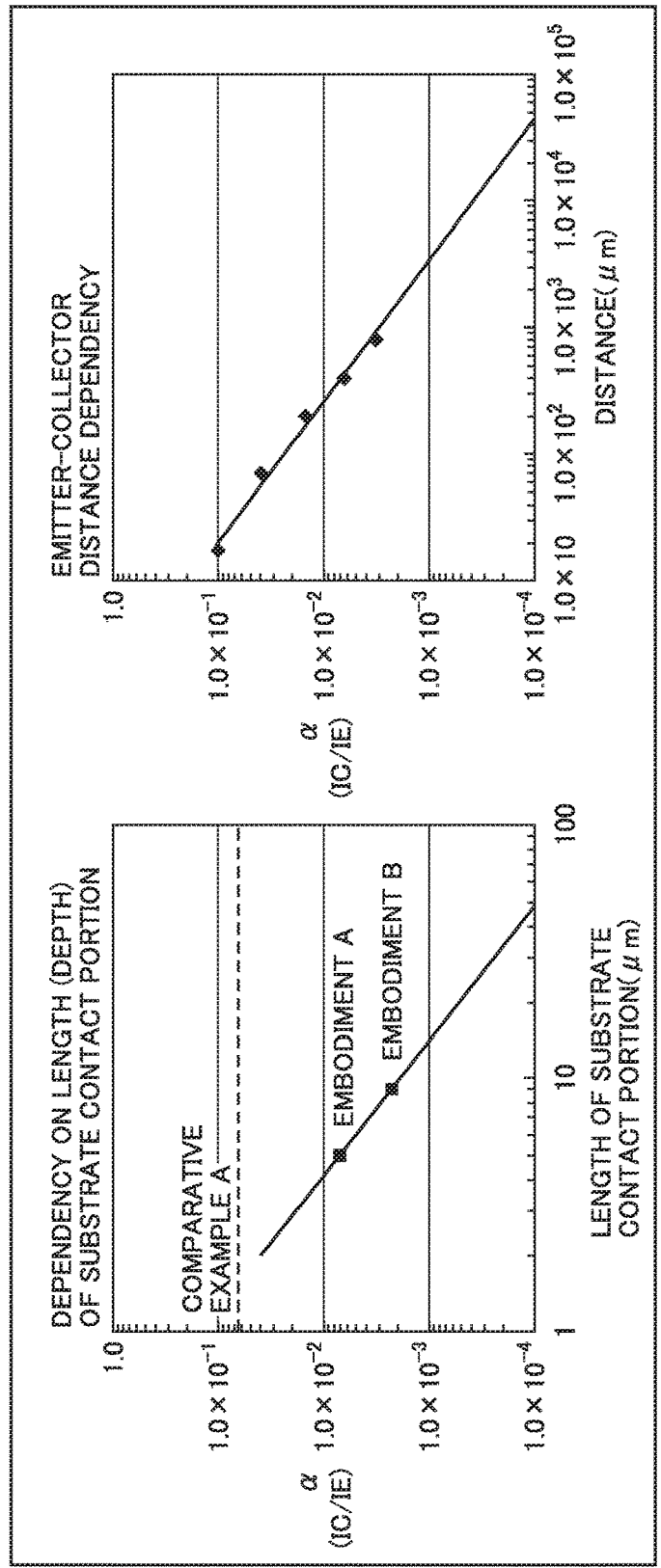
FIG. 24 is a diagram for explaining the effects of the semiconductor device in the first embodiment.

The left diagram in FIG. 24 is a graph (graph A) showing the dependency of α on the length (depth) of the substrate contact portion. The right diagram in FIG. 24 is a graph (graph B) showing the dependency of α on the distance between the emitter electrode and the collector electrode. In graph A, the horizontal axis represents the length of the substrate contact portion, that is, the length of the conductor in contact with the semiconductor substrate. The vertical axis represents the proportion α of current.

The graph A is based on the aforementioned simulation result, and the result of Embodiment A and the result of Embodiment B are plotted on the graph. In Embodiment A, the length of the conductor portion of substrate contact portion CLD in contact with the semiconductor substrate is 5 μm. In Embodiment B, the length of the conductor portion of substrate contact portion CLD in contact with the semiconductor substrate is 9 μm. Furthermore, the left diagram in FIG. 24 also shows the proportion α of current in Comparative Example A.

On the other hand, the graph B is based on the measured values of the actual semiconductor device. When the graph A and the graph B are compared, the value of proportion a of current in the case where the length (depth) of the substrate contact portion is set to 10 μm is equivalent to the value of proportion α of current in the case where the distance between the emitter electrode and the collector electrode is set to about 1 mm.

Increasing the distance between the emitter electrode and the collector electrode increases the size of the semiconductor device to prevent size reduction of the semiconductor device. It therefore can be said that increasing the length (depth) of the substrate contact portion instead of increasing the distance between the emitter electrode and the collector electrode greatly contributes size reduction of the semiconductor device.

Second Embodiment

Variations of the planar structure (pattern) of the substrate contact portion will now be described.

In the semiconductor device according to the foregoing embodiment, substrate contact portion CLD is formed in a region of semiconductor substrate SUB that is positioned between high voltage NMOS transistor formation region HVNR and CMOS transistor formation region CMR, by way of example. The arrangement pattern of substrate contact portion CLD is not limited to this example. Its variations will be described. Although the figures described below show partial plan views, hatching in the cross-sectional views are shown to clearly illustrate the structure.

First Example

Figure 25:
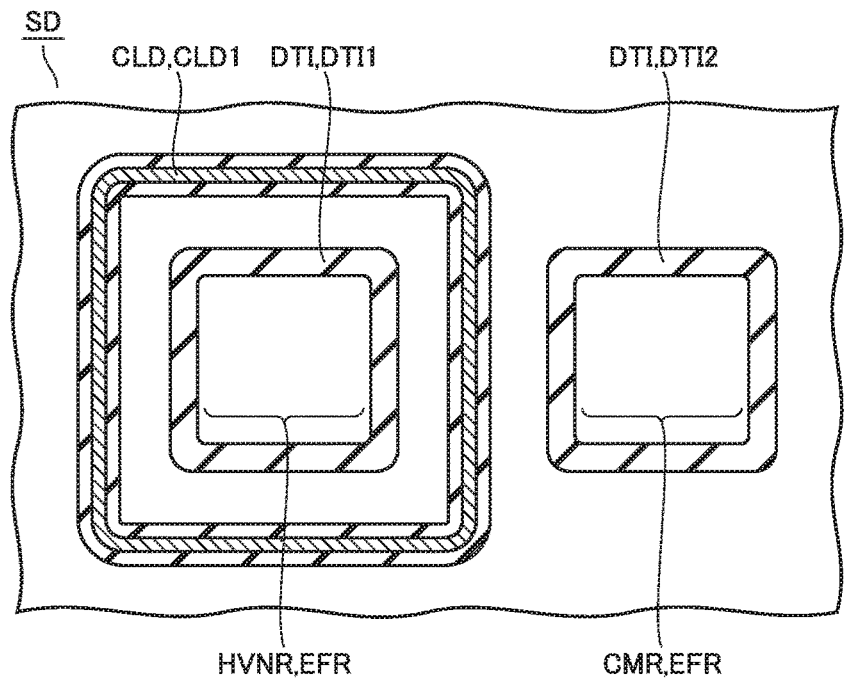
FIG. 25 is a partial plan view of a semiconductor device according to a first example in a second embodiment.

In a first example, as shown in FIG. 25, substrate contact portion CLD is disposed so as to surround the periphery of element isolation insulating film DTI1 defining high voltage NMOS transistor formation region HVNR. Here, it is assumed that the high voltage NMOS transistor is a semiconductor element in which carriers are likely to be emitted.

In this case, carriers diffusing in every direction from high voltage NMOS transistor formation region HVNR are effectively trapped by substrate contact portion CLD. As a result, carriers diffusing to the adjacent CMOS transistor formation region CMR or another element formation region (not shown) are reduced, thereby reliably suppressing malfunction of the semiconductor element.

Second Example

Figure 26:
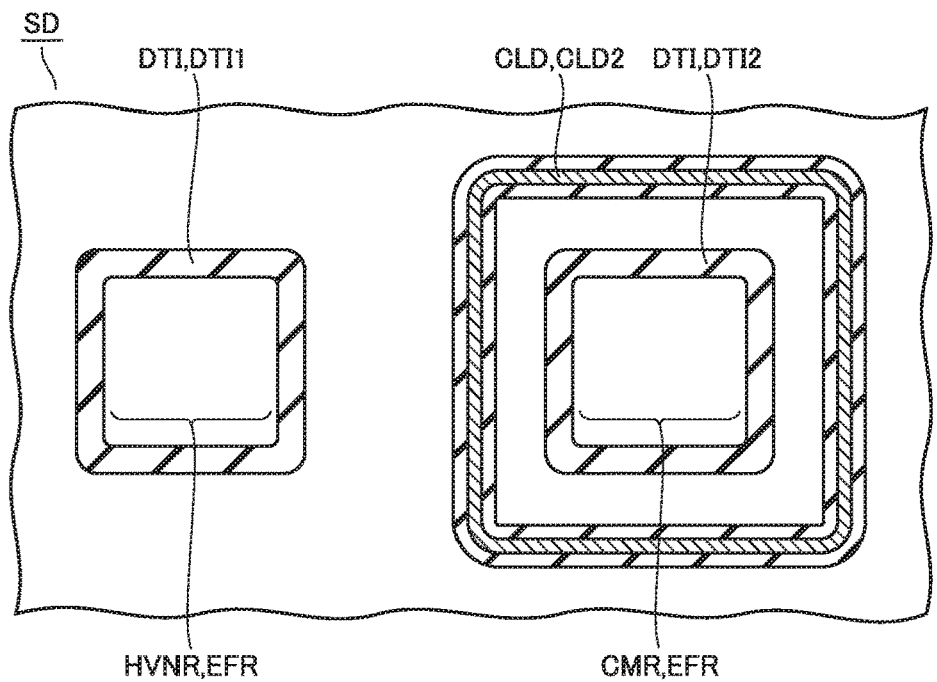
FIG. 26 is a partial plan view of a semiconductor device according to a second example in the second embodiment.

In a second example, as shown in FIG. 26, substrate contact portion CLD is disposed so as to surround the periphery of element isolation insulating film DTI2 defining CMOS transistor formation region CMR. Here, it is assumed that the CMOS transistor is a semiconductor element that is likely to receive carriers, that is, a semiconductor element into which carriers are likely to flow.

In this case, carriers diffusing toward CMOS transistor formation region CMR from every direction are effectively trapped by substrate contact portion CLD. This can reliably suppress malfunction of a semiconductor element, such as a CMOS transistor, into which carriers are likely to flow.

Third Example

Figure 27:
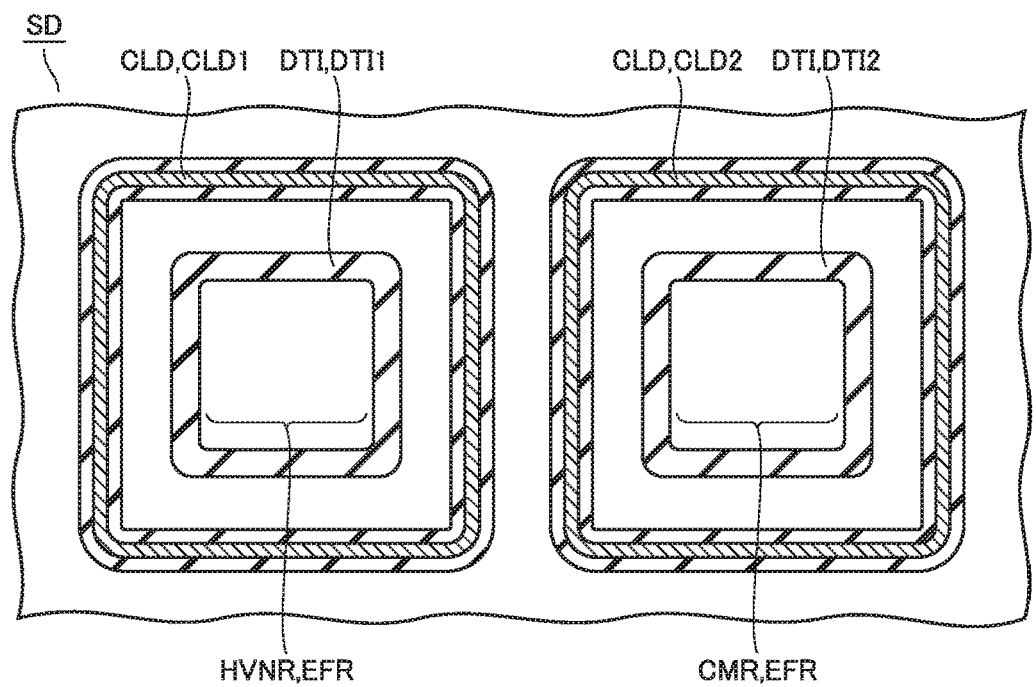
FIG. 27 is a partial plan view of a semiconductor device according to a third example in the second embodiment.

A third example has a combined structure of the first example and the second example. As shown in FIG. 27, substrate contact portion CLD1 is disposed so as to surround the periphery of element isolation insulating film DTI1 defining high voltage NMOS transistor formation region HVNR. Substrate contact portion CLD2 is disposed so as to surround the periphery of element isolation insulating film DTI2 defining CMOS transistor formation region CMR.

In this case, carriers diffusing in every direction from high voltage NMOS transistor formation region HVNR are effectively trapped by substrate contact portion CLD1. In addition, carriers diffusing toward CMOS transistor formation region CMR from every direction are effectively trapped by substrate contact portion CLD2. This can reliably suppress malfunction of a semiconductor element, such as a CMOS transistor, into which carriers are likely to flow.

Fourth Example

Figure 28:
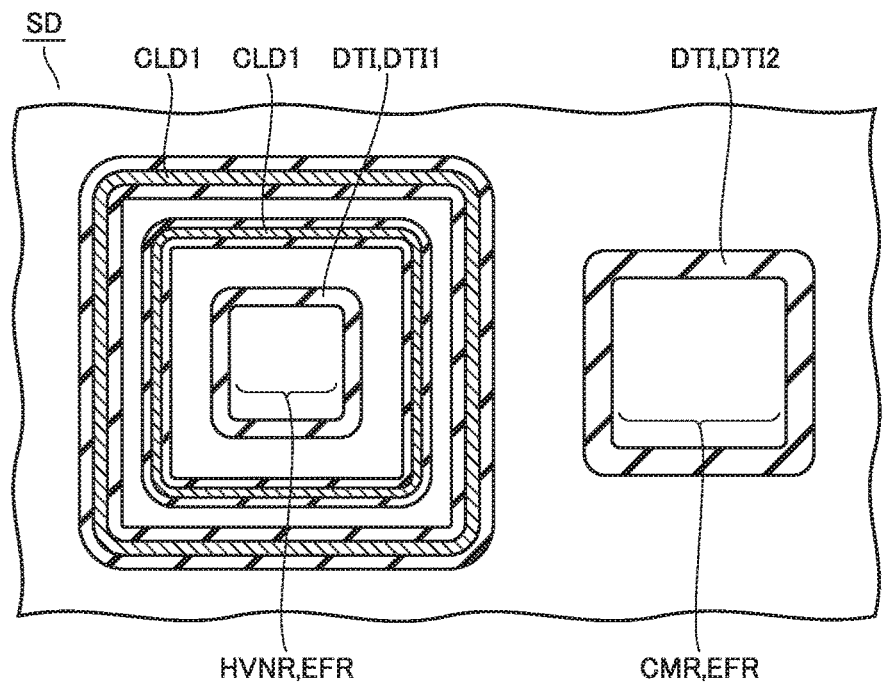
FIG. 28 is a partial plan view of a semiconductor device according to a fourth example in the second embodiment.

In a fourth example, as shown in FIG. 28, substrate contact portion CLD1 is disposed double so as to surround the periphery of element isolation insulating film DTI1 defining high voltage NMOS transistor formation region HVNR. Here, it is assumed that the high voltage NMOS transistor is a semiconductor element in which carriers are likely to be emitted.

In this case, of carriers diffusing in every direction from high voltage NMOS transistor formation region HVNR, the carriers that are not trapped by substrate contact portion CLD1 disposed inside and further diffuse in every direction, it any, can be trapped by substrate contact portion CLD1 disposed outside. This can more reliably suppress malfunction of a semiconductor element, such as a CMOS transistor, into which carriers are likely to flow.

Fifth Example

Figure 29:
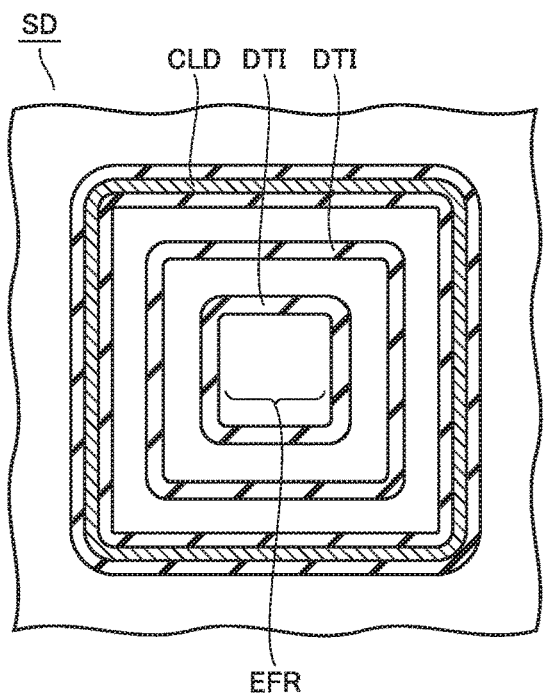
FIG. 29 is a partial plan view of a semiconductor device according to a fifth example in the second embodiment.
Figure 30:
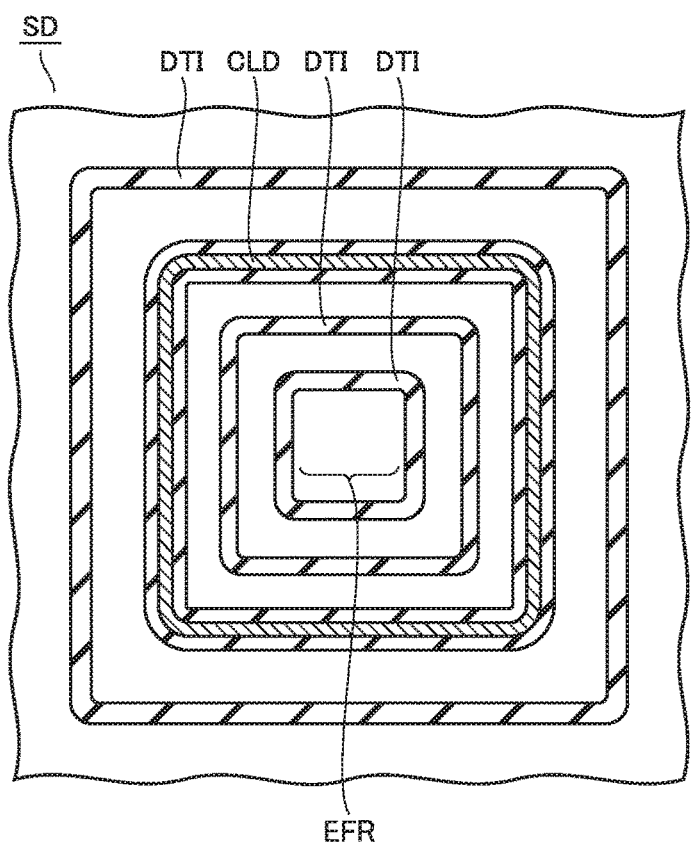
FIG. 30 is a partial plan view of a semiconductor device according to a sixth example in the second embodiment.

In a fifth example, as shown in FIG. 29, element isolation insulating film DTI is additionally formed so as to surround the periphery of element isolation insulating film DTI1 defining element formation region EFR. This configuration can suppress diffusion in every direction of carriers generated in the semiconductor element formed in the element formation region. Conversely, this configuration can suppress diffusion of carriers diffusing from every direction toward the semiconductor element formed in element formation region EFR. Thus, malfunction of the semiconductor element can be suppressed reliably, Sixth Example In a sixth example, as shown in FIG. 30, element isolation insulating film DTI is additionally formed so as to surround substrate contact portion CLD. This configuration can reliably suppress diffusion in every direction of carriers generated in the semiconductor element formed in the element formation region. Conversely, this configuration can reliably suppress diffusion of carriers diffusing from every direction toward the semiconductor element formed in element formation region FFR. Thus, malfunction of the semiconductor element can be suppressed more reliably.

In the foregoing semiconductor device, for convenience of explanation, high voltage NMOS transistor HVNR has been taken as an example of the semiconductor element in which carriers are likely to be emitted, and CMOS transistor CMR has been taken as an example of the semiconductor element into which carriers are likely to flow. They have been illustrated by way of example, and the structure of substrate contact portion CLD or the structure of element isolation insulating film DTI described above is applicable to a semiconductor device including a semiconductor element in which carriers are likely to be emitted and a semiconductor element into which carriers are likely to flow.

A variety of the structures described in the embodiments can be combined as necessary.

Although the present invention made by the inventors of the invention has been described in detail based on embodiments, it is clearly understood that the present invention is not limited to the foregoing embodiments and susceptible to various modifications without departing from the scope of the invention.

What is claimed is:
1. A semiconductor device comprising:
   a semiconductor substrate having a main surface;
   a first element formation region defined by a first insulating isolation portion reaching from said main surface to a first depth;
   a first semiconductor element formed in said first element formation region;
   a second element formation region disposed at a distance from said first element formation region and defined by a second insulating isolation portion reaching from said main surface to said first depth;
   a second semiconductor element formed in said second element formation region; and
   a substrate contact portion formed in a region of said semiconductor substrate that is positioned between said first element formation region and said second element formation region so as to reach from said main surface side to a second depth deeper than said first depth, said substrate contact portion being in contact with said semiconductor substrate from said first depth over said second depth,
   wherein the first insulating isolation portion and the second insulating isolation portion are each spaced apart from the substrate contact portion.

2. The semiconductor device according to claim 1, wherein said substrate contact portion is disposed so as to surround at least periphery of said first element formation region.

3. The semiconductor device according to claim 2, wherein a plurality of said first insulating isolation portions are disposed as said first insulating isolation portion,
the plurality of said first insulating isolation portions including;
a first insulating isolation first portion defining said first element formation region and
a first insulating isolation second portion disposed inside said substrate contact portion so as to surround periphery of said first insulating isolation first portion.

4. The semiconductor device according to claim 1, wherein
a plurality of said first insulating isolation portions are disposed as said first insulating isolation portion,
the plurality of said first insulating isolation portions including;
a first insulating isolation first portion defining said first element formation region and
a first insulating isolation second portion disposed so as to surround periphery of said first insulating isolation first portion and said substrate contact portion.

5. The semiconductor device according to claim 1, wherein
a plurality of said substrate contact portions are disposed as said substrate contact portion,
the plurality of said substrate contact portions including;
a substrate contact first portion and
a substrate contact second portion disposed so as to surround periphery of said substrate contact first portion.

6. The semiconductor device according to claim 1, wherein
a buried impurity region is formed in said semiconductor substrate, and
said first insulating isolation portion, said second insulating isolation portion, and said substrate contact portion are formed in such a manner as to pass through said buried impurity region.

7. The semiconductor device according to claim 1, wherein the first semiconductor element is a first transistor, and wherein entirety of the first transistor is formed in the first element formation region defined by the first insulating isolation portion.

8. The semiconductor device according to claim 7, wherein the second semiconductor element is a second transistor, and wherein entirety of the second transistor is formed in the second element formation region defined by the second insulating isolation portion.

9. A method of manufacturing a semiconductor device, comprising:
forming a first isolation groove defining a first element formation region and a second isolation groove defining a second element formation region to reach from a main surface of a semiconductor substrate to a first depth, and forming an opening reaching from said main surface of said semiconductor substrate positioned between said first isolation groove and said second isolation groove to said first depth;
forming a first semiconductor element in said first element formation region;
forming a second semiconductor element in said second element formation region;
forming an insulating film so as to fill said first isolation groove, said second isolation groove, and said opening to form a first insulating isolation portion in said first isolation groove and form a second insulating isolation portion in said second isolation groove;
successively performing processing on a portion of said insulating film buried in said opening and on said semiconductor substrate to form a contact opening passing through said insulating film to reach a second depth deeper than said first depth; and
forming a conductor in said contact opening to form a substrate contact portion in which said conductor is in contact with said semiconductor substrate at a portion from said first depth to said second depth.

10. The method of manufacturing a semiconductor device according to claim 9, wherein the forming said contact opening includes;
a first operation of removing a portion of said insulating film in such a manner as not to expose a sidewall surface of said opening from said main surface side to said first depth and
a second operation of removing a portion of said semiconductor substrate from said first depth to said second depth, and
in the operation of forming said substrate contact portion, said conductor is formed in such a manner that a portion of said insulating film is interposed between said conductor and said sidewall surface of said opening from said main surface side to said first depth.

11. The method of manufacturing a semiconductor device according to claim 9, wherein
the operation of forming said opening and said contact opening includes an operation of forming said opening and said contact opening so as to surround periphery of at least one of said first isolation groove and said second isolation groove, and
the operation of forming said substrate contact portion includes an operation of forming said substrate contact portion so as to surround periphery of at least one of said first insulating isolation portion and said second insulating isolation portion.

12. The method of manufacturing a semiconductor device according to claim 9, wherein
the operation of forming said opening has an operation of forming a plurality of said openings including a first opening and a second opening,
the operation of forming said contact opening includes an operation of forming a plurality of said contact openings, including forming a contact opening first portion in said first opening and forming a contact opening second portion in said second opening, and
the operation of forming said substrate contact portion includes an operation of forming a plurality of said substrate contact portions, including forming a substrate contact first portion in said contact opening first portion and forming a substrate contact second portion in said contact opening second portion.

13. The method of manufacturing a semiconductor device according to claim 9, wherein
the operation of forming said first isolation groove includes an operation of forming a plurality of said first isolation grooves, including forming a first isolation groove first portion and forming a first isolation groove second portion so as to surround said first isolation groove first portion from periphery, and
the operation of forming said first insulating isolation portion includes an operation of forming a plurality of said first insulating isolation portions, including forming a first insulating isolation first portion in said first isolation groove first portion and forming a first insulating isolation second portion in said first isolation groove second portion.

14. A semiconductor device comprising:
a semiconductor substrate having a main surface;
a first element formation region defined by a first insulating isolation portion reaching from said main surface to a first depth;
a first semiconductor element formed in said first element formation region;
a second element formation region disposed at a distance from said first element formation region and defined by a second insulating isolation portion reaching from said main surface to said first depth;
a second semiconductor element formed in said second element formation region; and
a substrate contact portion formed in a region of said semiconductor substrate that is positioned between said first element formation region and said second element formation region so as to reach from said main surface side to a second depth deeper than said first depth, said substrate contact portion being in contact with said semiconductor substrate from said first depth over said second depth,
wherein a plurality of said first insulating isolation portions are disposed as said first insulating isolation portion, the plurality of said first insulating isolation portions including:
a first insulating isolation first portion defining said first element formation region, and
a first insulating isolation second portion disposed inside said substrate contact portion so as to surround periphery of said first insulating isolation first portion.

* * * * *